US012666781B2

(12) United States Patent     (10) Patent No.:   US 12,666,781 B2

Liu et al.     (45) Date of Patent:    Jun. 23, 2026

(54) DISPLAY PANEL, DISPLAY DEVICE, AND PREPARATION METHOD

(71) Applicant: Hubei Yangtze Industrial Innovation Center Of Advanced Display Co., Ltd., Wuhan (CN)

(72) Inventors: Cao Liu, Wuhan (CN); Sitao Huo, Wuhan (CN)

(73) Assignee: Hubei Yangtze Industrial Innovation Center Of Advanced Display Co., Ltd., Wuhan (CN)

( * ) Notice: Subject to any disclaimer, the term of this patent is extended or adjusted under 35 U.S.C. 154(b) by 756 days.

(21) Appl. No.: 18/091,863

(22) Filed: Dec. 30, 2022

(65) Prior Publication Data

US 2023/0141534 A1     May 11, 2023

(30) Foreign Application Priority Data

Jun. 30, 2022    (CN) .......................... 202210773011.8

(51) Int. Cl.
H10H 29/853      (2025.01)
H10H 29/01      (2025.01)
(Continued)

(52) U.S. Cl.
CPC ........ H10H 29/853 (2025.01); H10H 29/032 (2025.01); H10H 29/0362 (2025.01);
(Continued)

(58) Field of Classification Search
CPC .... H10H 29/37; H10H 29/345; H10H 20/853;

H10H 29/855; H10H 29/14; H10H 29/142; H10H 29/24; H10H 29/352; H10H 29/852; H10H 29/853; H10H 29/8552; H10H 29/0362; H10H 29/0363; H10H 20/852;

(Continued)

(56) References Cited

U.S. PATENT DOCUMENTS

2016/0372528 A1* 12/2016 Kamura ................. H10K 30/87
2020/0235084 A1* 7/2020 Wu ......................... H10H 20/85
(Continued)

FOREIGN PATENT DOCUMENTS

CN      202231063 U     5/2012
CN      111462622 A   *   7/2020 ............. G09F 9/335
(Continued)

*Primary Examiner* — Ratisha Mehta
*Assistant Examiner* — Adam Joseph Mott
(74) *Attorney, Agent, or Firm* — KDW FIRM PLLC

(57) ABSTRACT

Provided are a display panel, a display device, and a preparation method. The display panel includes a base substrate, electrode units, a first light-emitting unit, bank structures and openings disposed among the bank structures, and a functional structure. The electrode units are disposed on a side of the base substrate, where the electrode units include a main electrode unit and a redundant electrode unit. The first light-emitting unit is electrically connected to the main electrode unit. The openings include a first opening, and the redundant electrode unit is disposed in the first opening. Part of first openings are filled with the functional structure, and the functional structure is at least partially disposed on a side of the redundant electrode unit facing away from the base substrate.

17 Claims, 12 Drawing Sheets

(51) Int. Cl.

| | |
|---|---|
| *H10H 29/24* | (2026.01) |
| *H10H 29/852* | (2025.01) |
| *H10H 29/855* | (2025.01) |
| *H10H 29/03* | (2025.01) |
| *H10H 29/80* | (2025.01) |
| *H10H 29/856* | (2025.01) |

(52) U.S. Cl.
CPC .......... *H10H 29/24* (2025.01); *H10H 29/852* (2025.01); *H10H 29/855* (2025.01); *H10H 29/8552* (2025.01); *H10H 29/03* (2025.01); *H10H 29/0363* (2025.01); *H10H 29/856* (2025.01); *H10H 29/882* (2025.01)

(58) Field of Classification Search
CPC ............ H10H 20/0362; H10H 20/0363; H01L 25/167
See application file for complete search history.

(56) References Cited

U.S. PATENT DOCUMENTS

| | | | | |
|---|---|---|---|---|
| 2020/0357846 A1* | 11/2020 | Lee | ..................... | H01L 25/0655 |
| 2021/0110748 A1* | 4/2021 | Kim | ....................... | H10H 20/01 |
| 2021/0408349 A1* | 12/2021 | Cai | ....................... | H10H 20/01 |
| 2022/0102325 A1* | 3/2022 | Yu | ....................... | H10H 20/8312 |
| 2023/0054489 A1* | 2/2023 | Yu | ........................ | H10H 29/142 |
| 2023/0112531 A1* | 4/2023 | Wu | ........................ | H10H 20/01 257/91 |

FOREIGN PATENT DOCUMENTS

| | | | | | |
|---|---|---|---|---|---|
| CN | 212659262 U | * | 3/2021 | | |
| CN | 112786760 A | | 5/2021 | | |
| CN | 113345336 A | | 9/2021 | | |
| CN | 114267770 A | * | 4/2022 | ........... | H10H 20/856 |

* cited by examiner

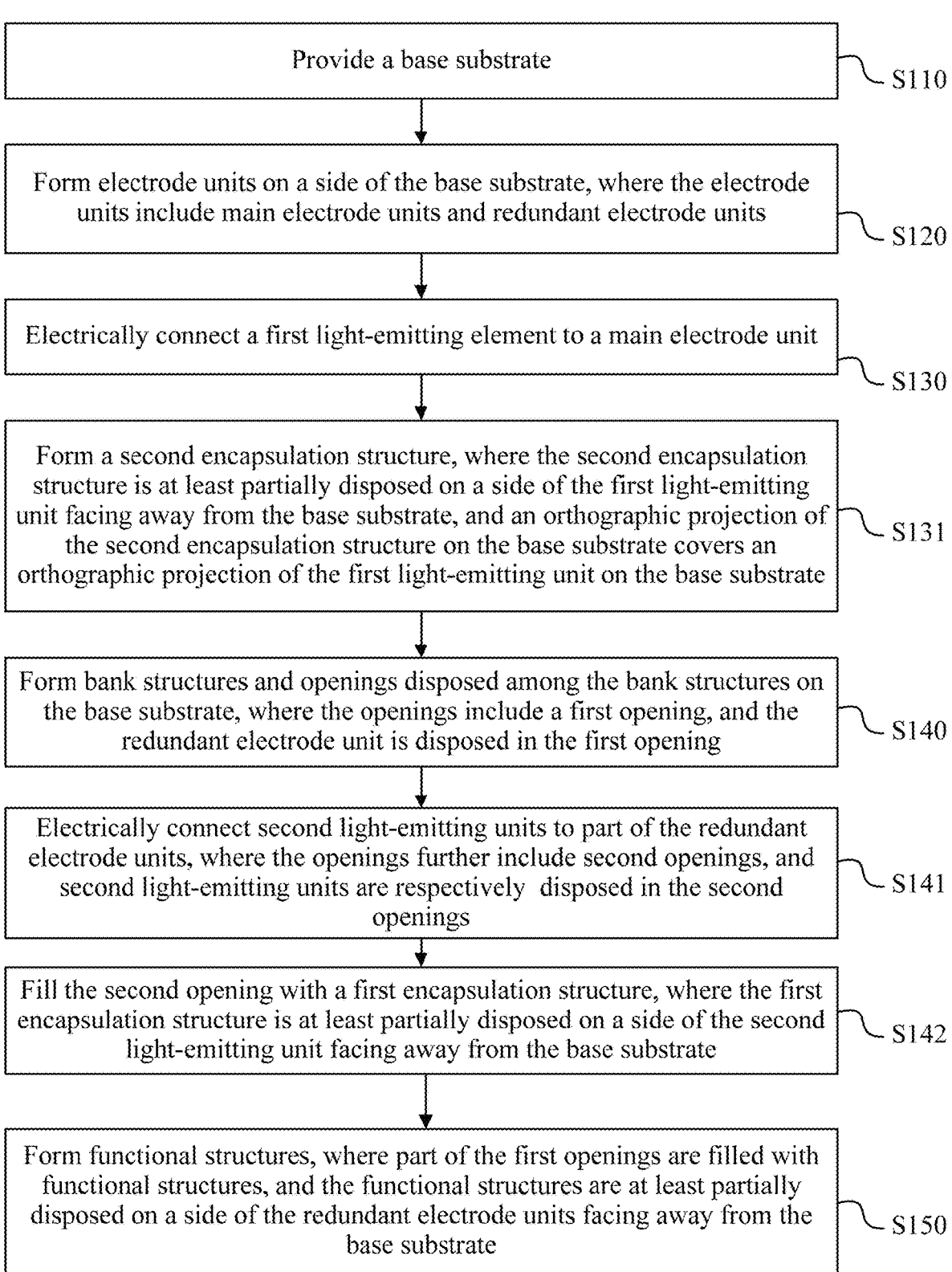

Provide a base substrate — S110

Form electrode units on a side of the base substrate, where the electrode units include main electrode units and redundant electrode units — S120

Electrically connect a first light-emitting element to a main electrode unit — S130

Form a second encapsulation structure, where the second encapsulation structure is at least partially disposed on a side of the first light-emitting unit facing away from the base substrate, and an orthographic projection of the second encapsulation structure on the base substrate covers an orthographic projection of the first light-emitting unit on the base substrate — S131

Form bank structures and openings disposed among the bank structures on the base substrate, where the openings include a first opening, and the redundant electrode unit is disposed in the first opening — S140

Electrically connect second light-emitting units to part of the redundant electrode units, where the openings further include second openings, and second light-emitting units are respectively disposed in the second openings — S141

Fill the second opening with a first encapsulation structure, where the first encapsulation structure is at least partially disposed on a side of the second light-emitting unit facing away from the base substrate — S142

Form functional structures, where part of the first openings are filled with functional structures, and the functional structures are at least partially disposed on a side of the redundant electrode units facing away from the base substrate — S150

DISPLAY PANEL, DISPLAY DEVICE, AND PREPARATION METHOD

CROSS-REFERENCE TO RELATED APPLICATION

This application claims priority to Chinese Patent Application No. 202210773011.8 filed Jun. 30, 2022, the disclosure of which is incorporated herein by reference in its entirety.

TECHNICAL FIELD

Embodiments of the present disclosure relate to the field of display technology and, in particular, to a display panel, a display device, and a preparation method.

BACKGROUND

For existing micro light-emitting diode (micro-LED) display panels or mini light-emitting diode (mini-LED) display panels, the light-emitting diodes (LEDs) are typically transferred to a display substrate for bonding through mass transfer technology. However, limited by the yield of the mass transfer technology, the display panel after the transfer will have some LEDs which emit light abnormally. Generally, the LEDs which emit light abnormally are not repaired directly, but positions of redundant electrodes are retained in pixels and new LEDs are bonded in the positions of the redundant electrode positions for compensation.

However, since the positions of the LEDs which emit light abnormally are uncertain, that is, the positions of the redundant electrodes to which the new LEDs are bonded are uncertain, all of the positions of the redundant electrodes are usually developed during a subsequent photolithography technique, so as to ensure that the repaired LEDs can emit light normally. However, at the same time, most of the positions of the redundant electrode not for repair are also directly exposed on the surface. In addition, since the redundant electrodes are typically metal electrodes with relatively high reflectivity, the exposed redundant electrodes increase the reflectivity of a whole screen body, influencing a display effect.

SUMMARY

The present disclosure provides a display panel, a display device, and a preparation method, so as to adjust the light extraction of the display panel, solve issues about the reflectivity or the light extraction efficiency of the display panel, and improve a display effect.

In a first aspect, embodiments of the present disclosure provide a display panel.

The display panel includes a base substrate, electrode units, a first light-emitting unit, bank structures and openings disposed among the bank structures, and a functional structure.

The electrode units are disposed on a side of the base substrate, where the electrode units include a main electrode unit and a redundant electrode unit.

The first light-emitting unit is electrically connected to the main electrode unit.

The openings include a first opening, and the redundant electrode unit is disposed in the first opening.

Part of first openings are filled with functional structures, and the functional structure is at least partially disposed on a side of the redundant electrode unit facing away from the base substrate.

In a second aspect, embodiments of the present disclosure provide a display device. The display device includes a base substrate, electrode units, a first light-emitting unit, bank structures and openings disposed among the bank structures, and a functional structure. The electrode units are disposed on a side of the base substrate, where the electrode units include a main electrode unit and a redundant electrode unit. The first light-emitting unit is electrically connected to the main electrode unit. The openings include a first opening, and the redundant electrode unit is disposed in the first opening. Part of first openings are filled with functional structures, and the functional structure is at least partially disposed on a side of the redundant electrode unit facing away from the base substrate.

In a third aspect, embodiments of the present disclosure further provide a preparation method of a display panel. The method includes the steps described below.

A base substrate is provided.

Electrode units are formed on a side of the base substrate, where the electrode units include a main electrode unit and a redundant electrode unit.

A first light-emitting element is electrically connected to the main electrode unit.

Bank structures and openings disposed among the bank structures are formed on the base substrate, where the openings include a first opening, and the redundant electrode unit is disposed in the first opening.

A functional structure is formed, where part of first openings are filled with functional structures, and the functional structure is at least partially disposed on a side of the redundant electrode unit facing away from the base substrate.

According to technical schemes in the embodiments of the present disclosure, the base substrate, the electrode units, the first light-emitting unit, the bank structures, and the functional structure are disposed in the display panel, where the electrode units are disposed on the side of the base substrate and include the main electrode unit and the redundant electrode unit: the first light-emitting unit is electrically connected to the main electrode unit; the openings are formed among the bank structures and include the first opening, where the redundant electrode unit is disposed in the first opening; and the first opening is filled with part of functional structures, and the functional structure is at least partially disposed on the side of the redundant electrode unit facing away from the base substrate. The bank structure may be used for limiting the functional structure so that the functional structure covers the redundant electrode unit.

BRIEF DESCRIPTION OF DRAWINGS

FIG. 4 is a flowchart of a preparation method of a display panel according to an embodiment of the present disclosure:

DETAILED DESCRIPTION

Figure 1:
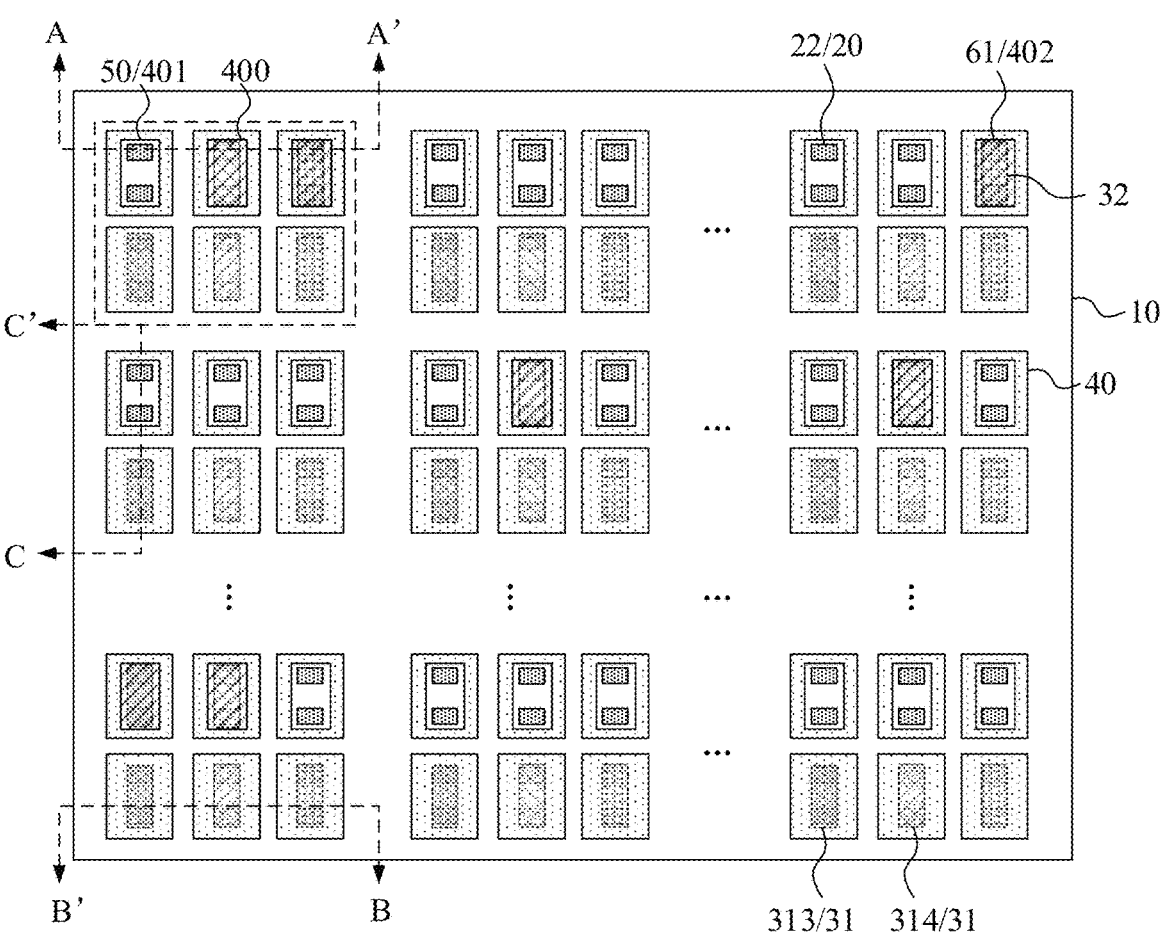
FIG. 1 is a structural diagram of a display panel according to an embodiment of the present disclosure.

Hereinafter the present disclosure is further described in detail in conjunction with the drawings and embodiments. It is to be understood that the embodiments set forth below are intended to illustrate and not to limit the present disclosure. Additionally, it is to be noted that, for ease of description, only part, not all, of structures related to the present disclosure are illustrated in the drawings.

Figure 2:
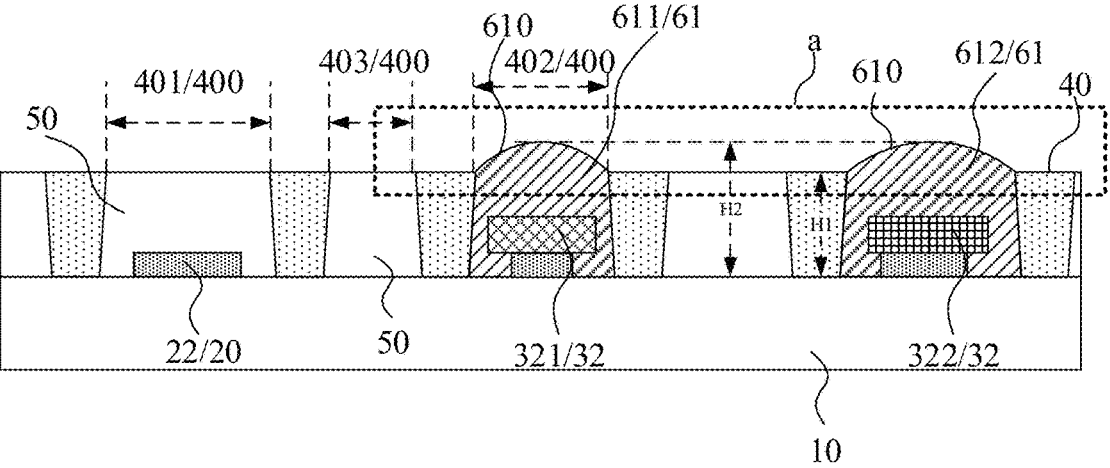
FIG. 2 is a sectional view of the display panel shown in FIG. 1 taken along AA'.
Figure 3:
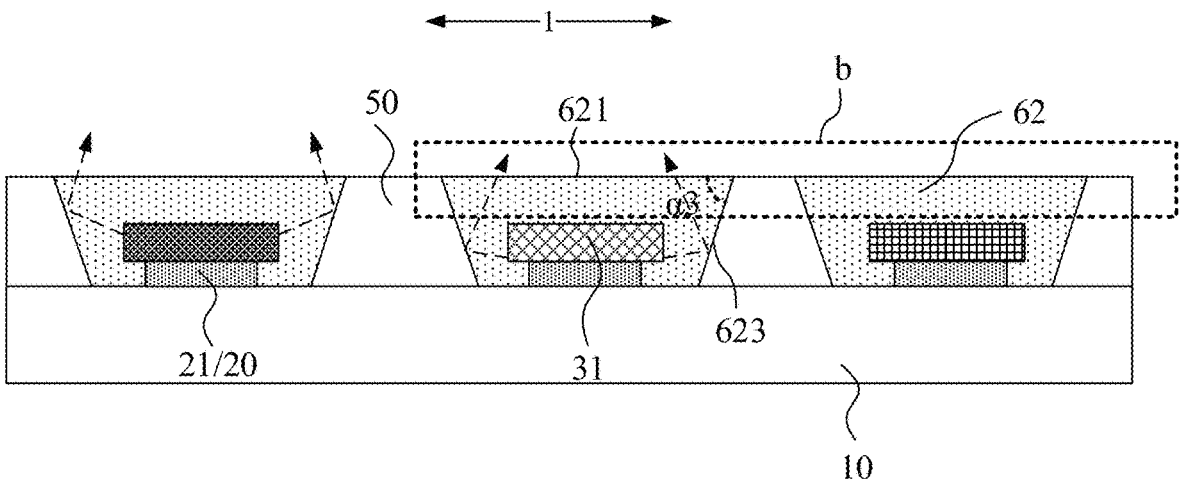
FIG. 3 is a sectional view of the display panel shown in FIG. 1 taken along BB'.

FIG. 1 is a structural diagram of a display panel according to an embodiment of the present disclosure. FIG. 2 is a sectional view of the display panel shown in FIG. 1 taken along AA'. FIG. 3 is a sectional view of the display panel shown in FIG. 1 taken along BB'. Referring to FIGS. 1 to 3, the display panel includes a base substrate 10, electrode units 20, first light-emitting units 31, bank structures 40) and openings 400 disposed among the bank structures 40, and functional structures 50. The electrode units 20 are disposed on a side of the base substrate 10, where the electrode units include main electrode units 21 and redundant electrode units 22. The first light-emitting unit 31 is electrically connected to the main electrode unit 21. The openings 400 include a first opening 401, and the redundant electrode unit 22 is disposed in the first opening 401. Part of first openings 401 are filled with functional structures 50 (white filling for illustration in the figures), and the functional structure 50 is at least partially disposed on a side of the redundant electrode unit 22 facing away from the base substrate 10.

The base substrate 10 may be a rigid substrate such as a glass substrate, or the base substrate 10 may be a flexible substrate such as a substrate made of a flexible organic polymer material, which is not limited here. A pixel circuit is disposed on the base substrate 10 and configured to drive a light-emitting unit to emit light. In an embodiment, the electrode unit 20 is further disposed on the base substrate 10, and the pixel circuit in the base substrate 10 is electrically connected to the light-emitting unit through the electrode unit 20 so as to drive the light-emitting unit to emit light.

In the embodiment of the present disclosure, the electrode units 20 include the main electrode unit 21 and the redundant electrode unit 22. The main electrode unit 21 is electrically connected to the first light-emitting unit 31. The redundant electrode unit 22 is used as a substitute for the main electrode unit 21 when the first light-emitting unit 31 emits light abnormally due to a connection failure or its own failure. That is, a new light-emitting unit is electrically connected to the redundant electrode unit 22 so that the compensation for the first light-emitting unit 31 which emits light abnormally is implemented. Here, the first light-emitting unit 31 may be understood as a main light-emitting unit, and the new light-emitting unit may be understood as a repair light-emitting unit. In addition, it is to be understood that to reduce process steps, essentially, during the actual preparation, the redundant electrode unit 22 and the main electrode unit 21 are prepared simultaneously through a photolithography technique in the same process step. The redundant electrode unit 22 and the main electrode unit 2 have the same specific structure, material, and function. A main difference between the redundant electrode unit 22 and the main electrode unit 2 is the design of positions of the electrode units. The electrode unit correspondingly connected to the first light-emitting unit 31 is the main electrode unit 21, and the remaining electrode unit may be considered as the redundant electrode unit 22.

It is to be noted that the main electrode unit 21 and the redundant electrode unit 22 may be an electrode pair here. The light-emitting unit correspondingly and electrically connected to the electrode pair is a horizontal mini-LED, micro-LED, nano light-emitting diode (nano-LED), or the like. That is, two electrodes of the light-emitting unit are on the same side of the light-emitting unit and correspondingly and electrically connected to two electrodes in the electrode pair respectively, thereby implementing the bonding of the light-emitting unit and the electrode unit.

In the embodiment of the present disclosure, the bank structure 40 is further disposed on the base substrate 10, and one of functions of the bank structure 40 is to limit a region in which the redundant electrode unit 22 is disposed. It is to be understood that the bank structures 40) are composed of multiple cross-connected walls disposed on the base substrate 10. The multiple cross-connected walls may enclose multiple openings 400. The opening 400 essentially refers to an accommodation space enclosed by the base substrate 10 as a bottom and the bank structures as sidewalls. A film or a structure may be disposed in the opening 400 enclosed by the bank structure 40 to cover the opening. Here, the openings 400 include a first opening 401 formed by walls around the redundant electrode unit 22, that is, part of the bank structures 40 are disposed around redundant electrode units 22, and openings 400 formed by the bank structures, that is, the first openings 401, may accommodate the redundant electrode units 22. Referring to FIG. 1, from a top view: the redundant electrode unit 22 is essentially disposed in the first opening 401.

In addition, the functional structure 50 is further disposed in the display panel in the embodiment of the present disclosure, and the functional structure 50 refers to a structure which has the function of adjusting external light incident on the display panel or the light emitted from the light-emitting unit in the display panel. In an embodiment, the functional structure 50 may be a structure for reducing the reflection of the external light to prevent the display panel from forming the specular effect. Of course, the functional structure 50 may be a structure which extracts the light emitted from the light-emitting unit to increase the light extraction efficiency, which is used for improving the brightness of the display panel. During the actual preparation, a whole adhesive layer of the functional structure 50 may be coated on the base substrate 10 to cover various structures on the base substrate 10, and the whole adhesive layer may be thinned through a thinning technique to expose the structures such as the bank structures on the base substrate 10. In this process, the opening 400 enclosed by the bank structure 40 may be filled with the functional structure 50 by using the limiting function of the bank structure 40. The first opening 401 is filled with the functional structure 50. Essentially, the functional structure 50 is used for covering the redundant electrode unit 22. In a specific form, part of the functional structures 50 in the first openings 401 are disposed on the side of the redundant electrode units 22 facing away from the base substrate 10, that is, the part of the functional structures 50 are disposed on the redundant electrode units 22. In addition, when a spacing exists between the redundant electrode unit 22 and the adjacent bank structure 40, the part of the functional structures 50 filling the first opening 401 may extend to the region of the spacing, that is, the part of the functional structures 50 filling the first opening 401 may directly cover the base substrate 10 in the region of the spacing. In addition, only part of the first openings 401 are filled with the functional structures 50. The main reason is that it is necessary to electrically connect a new light-emitting unit on a corresponding redundant electrode unit 22 when the first light-emitting unit 31 is abnormal, and in this case, the functional structure 50 does not exist in a first opening 401 in which such redundant electrode unit 22 is disposed.

It is to be understood that when the functional structure 50 is made of a light-absorbing material such as a black adhesive, and the functional structure 50 fills the first opening 401 so that the functional structure 50 covers the redundant electrode unit 22, the functional structure 50 may be used for preventing the external light being incident onto the redundant electrode unit 22 and preventing reflected light formed on the redundant electrode unit 22 from being emitted to the outside, thereby solving the issue that the redundant electrode unit 22 reflects light. When the functional structure 50 is made of a material having relatively high transmittance such as a white adhesive, the functional structure 50 may be used for reflecting light incident laterally into the functional structure 50 so that light emitted laterally from the light-emitting unit can also be reflected by the functional structure to be emitted to the outside, thereby increasing the amount of light emitted from the light-emitting unit and increasing the display brightness of the display panel. Of course, in the embodiment of the present disclosure, the functional structure 50 may be made of a material having a certain light transmission ability and a certain reflection-reducing ability, for example, a gray adhesive. The functional structure 50 can have the functions of reducing the light reflected by the redundant electrode unit and increasing the light emitted from the light-emitting unit, thereby improving the display effect of the display panel on the whole.

The black adhesive, the white adhesive, and the gray adhesive involved in the material selection for the preceding functional structure 50 may be silica gel, acrylic acid, or an epoxy-based material. Black or TiO particles are doped in the material and the doping ratio of the black or TiO particles is controlled so that a black, white, or gray effect can be achieved. Here, the adhesive is essentially a film material, which has good fluidity at medium and high temperatures (lower than 100° C.) and is polymerized at high temperatures (higher than 150° C.) to become a solid. Therefore, during the actual preparation, it is necessary to make the film material adhere on the base substrate through an adhering technique for optical adhesives, the film material is heated to the medium and high temperatures and then fills the bank structure 40, and afterwards the film material is baked at the high temperatures (higher than 150° C.) for 1 to 2 hours so that the film material loses viscosity and is completely polymerized to become the solid so that the curing is achieved.

Figure 5:
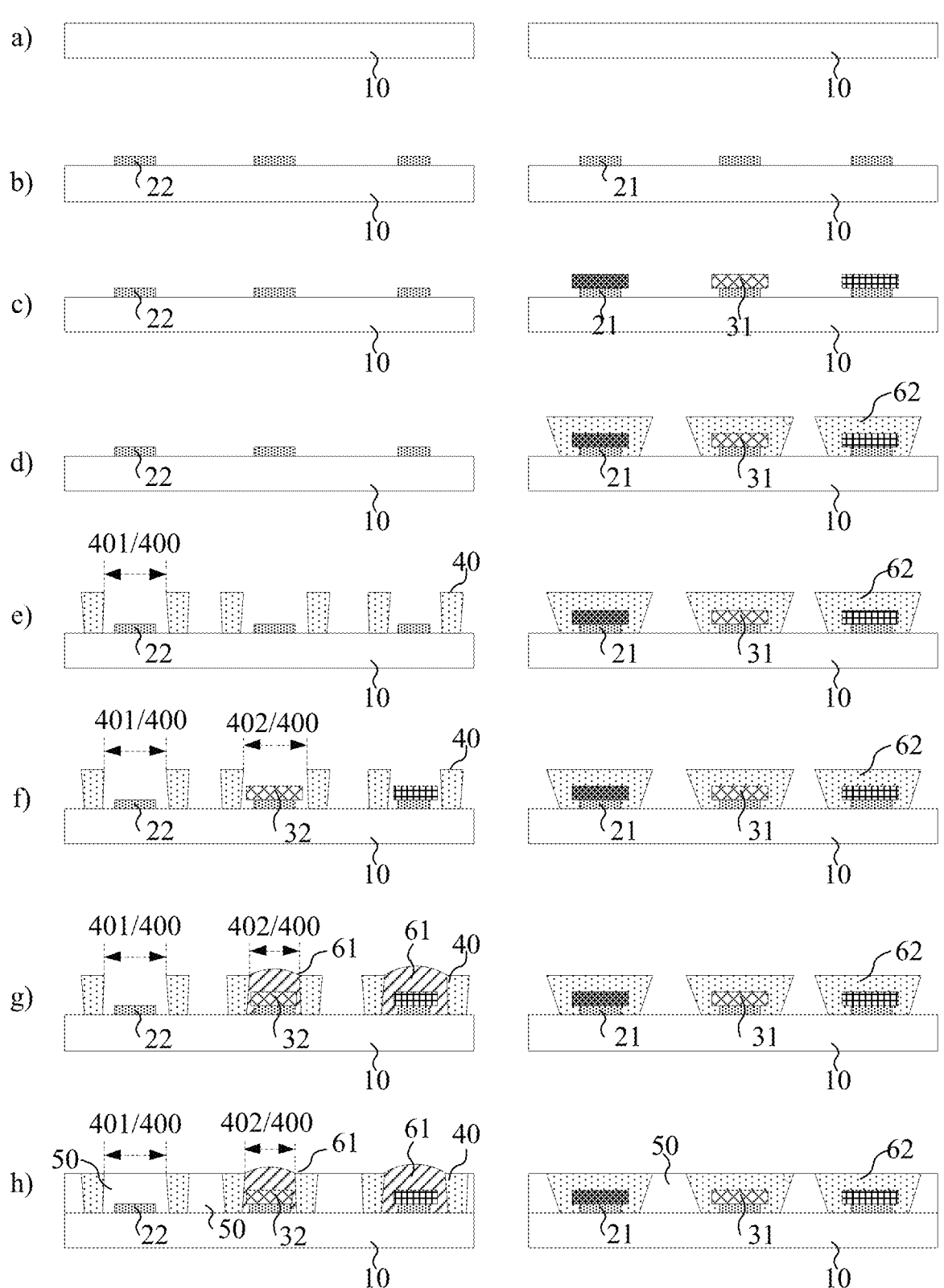
FIG. 5 is a structural flowchart of the preparation method of the display panel shown in FIG. 4.

For the display panel provided by the preceding embodiment, the present disclosure further provides a preparation method of the display panel. FIG. 4 is a flowchart of a preparation method of a display panel according to an embodiment of the present disclosure. FIG. 5 is a structural flowchart of the preparation method of the display panel shown in FIG. 4. Referring to FIGS. 4 and 5, the preparation method may include the steps described below:

In S110, a base substrate is provided.

Referring to figure a) in FIG. 5, as described above, the base substrate 10 may be the flexible substrate or the rigid substrate, which is not limited here. It is to be understood by those skilled in the art that the base substrate 10 here is not a simple substrate structure, and a pixel circuit structure for driving a light-emitting unit to emit light is also disposed thereon.

In S120, electrode units are formed on a side of the base substrate, where the electrode unit includes main electrode units and redundant electrode units.

Referring to figure b) in FIG. 5, the electrode units 20 here may be directly formed with a mask through a deposition technique. Alternatively, a whole electrode layer may be prepared, and then the electrode units 20 may be formed through a patterning technique. In an embodiment, the deposition technique may be thermal evaporation, magnetron sputtering, chemical vapor deposition, or the like, and the patterning technique may be the photolithography technique or the like. The electrode unit is generally made of a silver, aluminum, or alloy material, which is not limited here.

In S130, a first light-emitting element is electrically connected to a main electrode unit.

Referring to figure c) in FIG. 5, as described above, the first light-emitting unit 31 may be the mini-LED, the micro-LED, the nano-LED, or the like. Here, the first light-emitting unit 31 is electrically connected to the main electrode unit 21, which is essentially the process of bonding the LED unit on the main electrode unit 21. In an embodiment, it may be the process in which an electrode of the LED and an electrode in the main electrode unit 21 are correspondingly soldered to each other with cooled hot-melt solder.

In S140, bank structures and openings disposed among the bank structures are formed on the base substrate, where the openings include a first opening, and the redundant electrode unit is disposed in the first opening.

Referring to figure e) in FIG. 5, actually, a whole layer of a bank structure adhesive is coated and etched and then developed through the patterning technique such as the photolithography technique, and a cured region is retained so that the bank structures 40 here are formed. It is to be understood that the openings 400 may be formed synchronously during the etching process, and the redundant electrode units 22 are exposed in part of openings 400, that is, the first openings 401.

In S150, functional structures are formed, where part of the first openings are filled with functional structures, and the functional structures are at least partially disposed on a side of the redundant electrode units facing away from the base substrate.

Referring to figure h) in FIG. 5, here, the specific preparation process of the functional structures 50 is as described above. The details are not repeated here. It is to be further added that the adhesive may still cover the bank structures 40 after the whole adhesive layer adheres through the adhering technique for optical adhesives and is heated to make the adhesive layer flow and fill the first opening 401. Therefore, after the adhesive is baked at the high temperatures and cured, it is still necessary to thin the adhesive layer to expose the bank structure 40, which will be described in detail later.

According to the technical schemes in the embodiments of the present disclosure, the base substrate, the electrode units, the first light-emitting units, the bank structures, and the functional structures are disposed in the display panel, where the electrode units are disposed on the side of the base substrate and include the main electrode units and the redundant electrode units: the first light-emitting unit is electrically connected to the main electrode unit: the openings are formed among the bank structures and include the first opening, where the redundant electrode unit is disposed in the first opening; and the first opening is filled with part of the functional structures, and the functional structures are at least partially disposed on the side of the redundant electrode units facing away from the base substrate. The bank structure may be used for limiting the functional structure so that the functional structure covers the redundant electrode unit. According to the embodiments of the present disclosure, the issue that the redundant electrode exposed in the existing display panel has relatively high reflectivity so as to influence the display effect can be solved. The reflection of the redundant electrode unit can be reduced with the functional structure, thereby preventing the redundant electrode unit from reflecting the excessive light to form the specular effect, and thus a display quality can be improved. Alternatively, the light extraction efficiency of the light-emitting unit can be increased with the functional structure, thereby improving the display brightness of the display panel and also helping reduce the power consumption of the display panel.

With continued reference to FIGS. 1 to 3, the display panel further includes a second light-emitting unit 32 and a first encapsulation structure 61, where the openings 400 further include a second opening 402, the second light-emitting unit 32 is disposed in the second opening 402, and the first encapsulation structure 61 fills the second opening 402 and is at least partially disposed on a side of the second light-emitting unit 32 facing away from the base substrate 10.

When part of first light-emitting units 31 emit light abnormally, second light-emitting units 32 are essentially repair light-emitting units provided for the abnormal first light-emitting units 31. From a simple point of view: the two types of light-emitting units essentially have the same structure and function. Main differences between the two types of light-emitting units are that their positions designed in the display panel are different and the second light-emitting unit 32 is a substitute for the first light-emitting unit 31. Similarly, the second light-emitting unit 32 may be the mini-LED, the micro-LED, the nano-LED, or the like, which is not limited here. In addition, a pixel circuit is also disposed on the base substrate 10 for the redundant electrode unit 22. The pixel circuit is electrically connected to the second light-emitting unit 32 through the redundant electrode unit 22 so that the pixel circuit can drive the second light-emitting unit 32 to emit light.

In the embodiment of the present disclosure, the first encapsulation structure 61 is further disposed in the display panel. The first encapsulation structure 61 is a structure which separately encapsulates the second light-emitting unit 32 after the second light-emitting unit 32 is formed. It is to be emphasized that the bank structure 40 in the embodiment of the present disclosure limits a region in which the redundant electrode unit 22 is disposed and at the same time, the bank structure 40 also limits a region in which the second light-emitting unit 32 electrically connected to the redundant electrode unit 22 is disposed. Another important function of the bank structure 40 is to assist, with the limiting function, in the formation of the first encapsulation structure 61 when the second light-emitting unit 32 is encapsulated. Thus, it can be seen that the first encapsulation structure 61 actually is a structure filling the opening 400 enclosed by the bank structure 400 where the second light-emitting element 32 is disposed, that is, the second opening 402, so as to protect the second light-emitting unit 32 in the second opening 402. Further, in detail, part of the first encapsulation structure 61 is essentially disposed on the side of the second light-emitting unit 32 facing away from the base substrate 10, that is, the part of the first encapsulation structure 61 is on the second light-emitting unit 32. In addition, when a spacing exists between the second light-emitting unit 32 and the adjacent bank structure 40, the part of the first encapsulation structure 61 filling the second opening 402 extends to the region of the spacing, that is, the part of the first encapsulation structure 61 in the second opening 402 directly covers the base substrate 10 in the region of the spacing.

In addition, it is to be further noted that since the functional structure 50 fills the first opening 401 and the first encapsulation structure 61 fills the second opening 402, it is necessary to define at least the position of the first opening 401 or the position of the second opening 402 when the functional structure 50 and the first encapsulation structure 61 are prepared. During the actual preparation, optionally, the position of the second opening 402 is determined according to the second light-emitting unit 32 in the embodiment of the present disclosure, and the first encapsulation structure 61 precisely fills the second opening 402 through a printing technique.

Thus, it can be seen that the preparation method of the display panel provided by the present disclosure may further include the steps of forming the second light-emitting unit and the first encapsulation structure. In an embodiment, with continued reference to FIGS. 4 and 5, after step S130 and before step S150, the preceding preparation method may further include the steps described below:

In S141, second light-emitting units are electrically connected to part of the redundant electrode units, where the openings further include the second openings, and the second light-emitting units are respectively disposed in the second openings.

Referring to figure f) in FIG. 5, as described above, the second light-emitting unit 32 may also be the mini-LED, the micro-LED, the nano-LED, or the like. Here, the second light-emitting units 32 are electrically connected to the part of the redundant electrode units 22, which may also be understood as the process of bonding the LED units on the redundant electrode units 22. In an embodiment, it may also be the process in which the electrode of the LED and the electrode in the redundant electrode unit 21 are correspondingly soldered with the cooled hot-melt solder.

Further, based on the preceding preparation method, the following step needs to be provided before step S141.

In S1401, a failed first light-emitting unit is detected and a position of a main electrode unit of the failed first light-emitting unit is determined.

It is to be understood that the second light-emitting unit 32 is essentially the substitute for the failed first light-emitting unit 31. Therefore, before the second light-emitting units 32 are electrically connected to the part of the redundant electrode units 22, it is necessary to determine positions of the part of the redundant electrode units 22 first, that is, it is necessary to detect positions of the failed first light-emitting units 31 and then to determine, according to the positions of the failed first light-emitting units 31, the positions of the redundant electrode units 22 which need to be electrically connected to the second light-emitting units 32.

Thus, in this case, step S141 may be refined as: in S1411, the second light-emitting element 32 is electrically connected to the redundant electrode unit 22 corresponding to and adjacent to the main electrode unit 21 of the failed first light-emitting unit 31.

Further, the following step may be included after the preceding step S141.

In S142, the second opening is filled with the first encapsulation structure, where the first encapsulation structure is at least partially disposed on a side of the second light-emitting unit facing away from the base substrate.

Referring to figure g) in FIG. 5, in this step, the process of forming the first encapsulation structure 61 is essentially the process of precisely filling the second opening 402 with the first encapsulation structure 61 on the basis that the second opening 402 has been known. During the actual preparation, for the first encapsulation structure 61, a transparent resin material may be used for filling the second opening 402 enclosed by the bank structure 40, and then the transparent resin material is cured with ultraviolet light, thereby implementing the encapsulation of the second light-emitting unit 32 in the second opening 402.

Thus, this step S142 may also be refined so that two sub-steps described below are obtained.

In S1421, it is determined that the opening enclosed by the bank structure corresponding to the redundant electrode unit electrically connected to the second light-emitting unit is the second opening.

In S1422, the second opening is filled with the first encapsulation structure through printing technique.

Here, the printing technique refers to that the position of the redundant electrode unit 22 to which the second light-emitting unit 32 is bonded is scanned with a high-precision printing device, that is, the position of the second opening 402 where the second light-emitting unit 32 is disposed is determined first through the scan, then the transparent resin is printed in the second opening 402, and finally the transparent resin in the second opening 402 is cured through the ultraviolet light so that the stable first encapsulation structure 61 is formed.

It is to be understood that the failure of the first light-emitting unit 31 may occur at a certain probability after a batch transfer of the first light-emitting units 31 is completed and the first light-emitting units 31 are electrically connected to main electrode units 21. In addition, since the failed first light-emitting unit 31 is random, the position of the redundant electrode unit 22 which needs to be electrically connected to the second light-emitting unit 32, that is, the position of the redundant electrode unit which needs to perform a repair, is unfixed. After the electrical connection to the second light-emitting unit 32, that is, the repair, is completed, though the position of the repair second light-emitting unit 32 has been determined, a preparation technique which needs the mask, for example, nanoimprint, is also not applicable when the functional structure 50 covers a redundant electrode unit 22 which is not connected to a second light-emitting unit 32. The reason is that the second light-emitting unit 32 has different positions on different panels, an opening is disposed in the mask according to the position of a redundant electrode unit 22 which is on a certain panel and not connected to a second light-emitting unit 32, and the mask is only applicable to this single panel but not applicable to another panel when the functional structure 50 covering the redundant unit 22 is manufactured. Therefore, the process step of forming the functional structure 50 through the preparation technique which needs the mask is not applicable to industrial batch production.

However, according to the preparation method provided by the embodiment of the present disclosure, the determined second light-emitting unit 32 on each display panel is precisely printed through the printing technique so that the encapsulation structure is formed. During the actual preparation, the display panel is scanned to determine the position of the second light-emitting unit 32, and then the second light-emitting unit 32 is printed and encapsulated. After the encapsulation of the second light-emitting unit 32 is completed, the whole base substrate 10 is coated with a functional structure adhesive layer so that the functional structure adhesive layer fills the opening 400 corresponding to the redundant electrode unit 22 which is not connected to the second light-emitting unit 32. With this technical process, not only can the second light-emitting unit 32 be effectively encapsulated to avoid external damage to the second light-emitting unit 32 and the service life of the second light-emitting unit 32 be ensured, but also the second light-emitting 32 having the random position can be precisely encapsulated and the functional structure 50 covers the redundant electrode unit 22 which is not connected to the second light-emitting unit 32. The whole technical process is more free and flexible and can meet the requirement of industrial batch production.

It is to be noted that according to the example in the preceding embodiment, the second light-emitting unit is electrically connected to the redundant electrode unit 22 in the second opening 402 after a second encapsulation structure is formed, that is, the repair is performed with the second light-emitting unit 32 after the encapsulation of the first light-emitting unit 31 is completed. However, since the second encapsulation structure 62 and the bank structure 40) are formed synchronously during the actual preparation, bonding the second light-emitting unit 32 on the redundant electrode unit 22 provided with the bank structure 40 may be limited by the bank structure 40), thereby influencing a bonding effect. Based on this, in the embodiment of the present disclosure, it may be considered that the repair after the encapsulation is performed in the manner of a laser transfer, thereby avoiding the influence of the bank structure 40 on bonding the second light-emitting unit 32.

In other embodiments of the present disclosure, optionally, the failed first light-emitting unit is determined before the first light-emitting unit is encapsulated, the repair is performed with the second light-emitting unit 32, and finally the first light-emitting unit 31 is encapsulated and the second light-emitting unit 32 is encapsulated. In conclusion, the sequence of the step of encapsulating the first light-emitting unit 31 and the step of performing the repair with the second light-emitting unit 32 is not limited in the embodiment of the present disclosure, and those skilled in the art may perform selection and design according to actual requirements.

Based on the actual preparation technique of the first encapsulation structure, the first encapsulation structure may be designed to have a special shape in the embodiment of the present disclosure, which is described below: With continued reference to FIG. 2, the first encapsulation structure 61 includes a top surface 610, where the top surface 610 is disposed, along a direction perpendicular to a plane in which the base substrate 10 is located, on a side of the first encapsulation structure 61 facing away from the base substrate 10; and the top surface 610 is an arc surface and protrudes toward a direction away from the base substrate 10.

During the actual preparation, for the first encapsulation structure 61, a flexible adhesive is first used for filling the second opening 402 to cover the second light-emitting unit 32, and then the flexible adhesive is cured so that the first encapsulation structure 61 is formed to protect the second light-emitting unit 32. In the embodiment of the present disclosure, to ensure the encapsulation effect of the first encapsulation structure 61, the second opening 402 is generally completely filled with the flexible adhesive. In addition, since light emitted from the second light-emitting unit 32 needs to be emitted out through the first encapsulation structure 61, in an embodiment, the first encapsulation structure 61 is optionally provided with the top surface 610 which is a protruding arc surface. During the preparation, the cured first encapsulation structure 61 has a relatively hard material, and when the functional structure is thinned, the thinning technique thereof has less action on the cured first encapsulation structure 61 so that the protruding arc surface formed by curing the first encapsulation structure 61 can be retained. In a specific form, the top surface 610 is disposed on the side of the first encapsulation structure 61 facing away from the base substrate 10, that is, the upper surface of the first encapsulation structure 61. The top surface 610 is the arc surface, and the arc surface 610 protrudes towards the direction away from the base substrate 10, that is, the arc surface 610 protrudes upward. Based on this design, optionally, the flexible adhesive fills relatively in excess the second opening 402 during the actual preparation to form the preceding protruding arc surface. The protruding arc surface on the first encapsulation structure 61 can function like a convex lens, and the light emitted from the second light-emitting unit 32 inside the first encapsulation structure 61 can be focused and emitted upward, thereby ensuring the light extraction efficiency of the second light-emitting unit 32.

With continued reference to FIG. 2, in a direction perpendicular to the base substrate 10, a height difference between the top surface 610 and the surface of a side of the bank structure 40) facing away from the base substrate 10 is less than or equal to 6 μm. The surface of the side of the bank structure 40 facing away from the base substrate 10 refers to the upper surface of the bank structure 40. The height of the upper surface of the bank structure 40 with respect to the base substrate 10 is H1 as shown in FIG. 2, and the height of the top surface 610 on the base substrate 10 is H2 as shown in FIG. 2, where H2−H1≤6 μm, which can ensure that the first encapsulation structure 61 has the protruding arc surface with a certain height, that is, the protruding arc surface has a certain radian. The protruding arc surface is used for implementing the function of effectively focusing the light so that the light emitted from the second light-emitting unit 32 in the first encapsulation structure 61 is emitted to the outside as much as possible.

Considering that light-emitting units of different colors may have inconsistent light emission efficiencies, in the embodiment of the present disclosure, light emission effects of second light-emitting units of different colors are optionally balanced when the second light-emitting units are encapsulated. With continued reference to FIG. 2, optionally, the second light-emitting unit 32 includes a first-color light-emitting unit 321 and a second-color light-emitting unit 322; and the first encapsulation structure 61 includes a first encapsulation sub-structure 611 and a second encapsulation sub-structure 612. The first encapsulation sub-structure 611 corresponds to the first-color light-emitting unit 321, and the second encapsulation sub-structure 612 corresponds to the second-color light-emitting unit 322; and the area of an orthographic projection of the top surface of the first encapsulation sub-structure 611 on the base substrate 10 is smaller than the area of an orthographic projection of the top surface of the second encapsulation sub-structure 612 on the base substrate 10. A wavelength of light emitted from the first-color light-emitting unit 321 is greater than a wavelength of light emitted from the second-color light-emitting unit 322.

Here, the first-color light-emitting unit 321 and the second-color light-emitting unit 322 may be understood as a red light-emitting unit and a green light-emitting unit, respectively. In comparison, the red light-emitting unit has a relatively low light emission efficiency. Of course, this embodiment is also applicable to other light-emitting units of any two colors having different light emission efficiencies such as a green light-emitting unit and a blue light-emitting unit.

Based on this, in the embodiment of the present disclosure, the first encapsulation structure 61 of the first-color light-emitting unit 321 and the first encapsulation structure 61 of the second-color light-emitting unit 322 are set different from each other, the object of which is to use the different first encapsulation structures 61 for balancing the light emitted from the light-emitting units of the two colors. In an embodiment, the first-color light-emitting unit 321 corresponds to the first encapsulation sub-structure 611, which refers to that the first encapsulation sub-structure 611 fills the second opening 402 in which the first-color light-emitting unit 321 is disposed, and the first encapsulation sub-structure 611 is at least partially disposed on a side of the first-color light-emitting unit 321 facing away from the base substrate 10. Similarly, the second-color light-emitting unit 322 corresponds to the second encapsulation sub-structure 612, which refers to that the second encapsulation sub-structure 612 fills the second opening 402 in which the second-color light-emitting unit 322 is disposed, and the second encapsulation sub-structure 612 is at least partially disposed on a side of the second-color light-emitting unit 322 facing away from the base substrate 10. In this embodiment, the area of the orthographic projection of the top surface of the first encapsulation sub-structure 611 on the base substrate 10) is smaller than the area of the orthographic projection of the top surface of the second encapsulation sub-structure 612 on the base substrate 10. Essentially, the area of the orthographic projection of the top surface of the first encapsulation sub-structure 611 is reduced so that the top surface of the first encapsulation sub-structure 611 protrudes at a more apparent radian among the two encapsulation sub-structures with the same height. The first-color light-emitting unit 321 can implement, through the top surface protruding more apparently, the function of focusing the light more efficiently so that the light emitted from the first-color light-emitting unit 321 in the first encapsulation sub-structure 611 is more emitted to the outside. Thus, the relatively low light emission efficiency of the first-color light-emitting unit 321 is compensated, the amount of light emitted from the light-emitting units of the two colors is balanced, and the brightness of the light-emitting units having the different light emission efficiencies is equalized, thereby ensuring the display effect.

Figure 6:
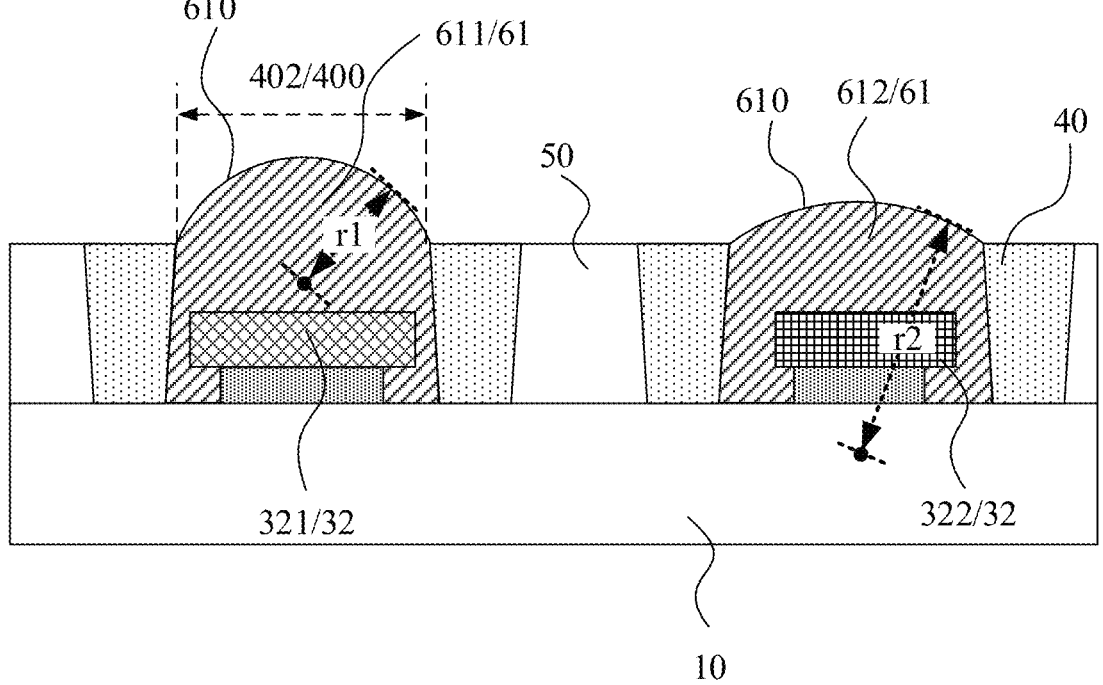
FIG. 6 is a sectional view of another display panel according to an embodiment of the present disclosure.

FIG. 6 is a sectional view of another display panel according to an embodiment of the present disclosure.

Referring to FIG. 6, in another embodiment of the present disclosure, optionally, the second light-emitting unit 32 includes the first-color light-emitting unit 321 and the second-color light-emitting unit 322: the first encapsulation structure 61 includes the first encapsulation sub-structure 611 and the second encapsulation sub-structure 612. The first encapsulation sub-structure 611 corresponds to the first-color light-emitting unit 321, and the second encapsulation sub-structure 612 corresponds to the second-color light-emitting unit 322; and a sectional shape of the top surface of the first encapsulation sub-structure 611 on a first plane is a first arc, and a sectional shape of the top surface of the second encapsulation sub-structure 612 on the first plane is a second arc, where a radius of curvature r1 corresponding to the first arc is smaller than a radius of curvature r2 corresponding to the second arc, and the first plane is perpendicular to the base substrate 10.

As described above, since the top surface 610 of the first encapsulation structure 61 is the protruding arc surface, an arc is formed in a section of the top surface of the first encapsulation sub-structure 611 on the plane perpendicular to the base substrate 10, that is, the first plane. In the embodiment of the present disclosure, the object of setting the top surface of the encapsulation structure to be the protruding arc surface is to cause the encapsulation structure to function like the convex lens. In addition, it is to be known by those skilled in the art that the higher curvature the surface of the convex lens has, the shorter the focal length thereof is, and the higher the focusing ability thereof is. Therefore, the curvature of the top surface of the first encapsulation sub-structure 611 corresponding to the first-color light-emitting unit 321 and the curvature of the top surface of the second encapsulation sub-structure 612 respectively corresponding to the second-color light-emitting unit 322 are distinguished so that the focusing abilities of the two encapsulation sub-structures are changed. Thus, the light extraction efficiencies of the first-color light-emitting unit 321 and the second-color light-emitting unit 322 can be further balanced. In an embodiment, the radius of curvature r1 of the first arc corresponding to the top surface of the first encapsulation sub-structure 611 is set smaller than the radius of curvature r2 of the second arc corresponding to the top surface of the second encapsulation sub-structure 612. Essentially, the curvature of the top surface of the first encapsulation sub-structure 611 is relatively increased so that the focusing ability of the first encapsulation sub-structure 611 is relatively increased. Thus, for the light emitted from the first-color light-emitting unit 321 having the relatively low light emission efficiency in the first encapsulation sub-structure 611, the brightness of the light-emitting units having the different light emission efficiencies is further equalized, thereby ensuring the display effect.

With continued reference to FIGS. 1 and 3, the display panel further includes the second encapsulation structure 62 at least partially disposed on a side of the first light-emitting unit 31 facing away from the base substrate 10, where an orthographic projection of the second encapsulation structure 62 on the base substrate 10 covers an orthographic projection of the first light-emitting unit 31 on the base substrate 10, and a distance from the surface of a side of the second encapsulation structure 62 facing away from the base substrate 10 to the base substrate 10 is equal to a distance from the surface of the side of the bank structure 40 facing away from the base substrate 10 to the base substrate 10.

Here, second encapsulation structures 62 are encapsulation structures formed through the batch encapsulation of the first light-emitting units 31 after the first light-emitting units 31 are transferred in batch and bonded on the corresponding main electrode units 21. In an embodiment, after the first light-emitting units 31 are transferred in batch and bonded on the corresponding main electrode units 21, a whole encapsulation adhesive layer may be coated on the base substrate 10, and the encapsulation adhesive layer is patterned through the photolithography technique, thereby forming an independent second encapsulation structure 62 for each of the first light-emitting units 31.

To ensure a good encapsulation effect, the second encapsulation structure 62 needs to cover the first light-emitting unit 31 completely, and from the perspective of projection, the orthographic projection of the second encapsulation structure 62 on the base substrate 10 covers the orthographic projection of the first light-emitting unit 31 on the base substrate 10. In addition, part of the second encapsulation structure 62 may be disposed on the first light-emitting unit 31, that is, the part of the second encapsulation structure 62 may be disposed on the side of the first light-emitting unit 31 facing away from the base substrate 10. In addition, part of the second encapsulation structure 62 may extend to a peripheral region of the first light-emitting unit 31 and directly cover the base substrate 10 in the peripheral region of the first light-emitting unit 31.

Based on this, the preparation method provided by the preceding embodiment may further include the process of preparing the second encapsulation structure. In an embodiment, with continued reference to FIGS. 4 and 5, after step S130, the following steps may further be included.

In S131, the second encapsulation structure is formed, where the second encapsulation structure is at least partially disposed on the side of the first light-emitting unit facing away from the base substrate, and the orthographic projection of the second encapsulation structure on the base substrate covers the orthographic projection of the first light-emitting unit on the base substrate.

Referring to figure d) in FIG. 5, the preparation technique of the second encapsulation structure 62 is as described above. The details are not repeated here.

Figure 7:
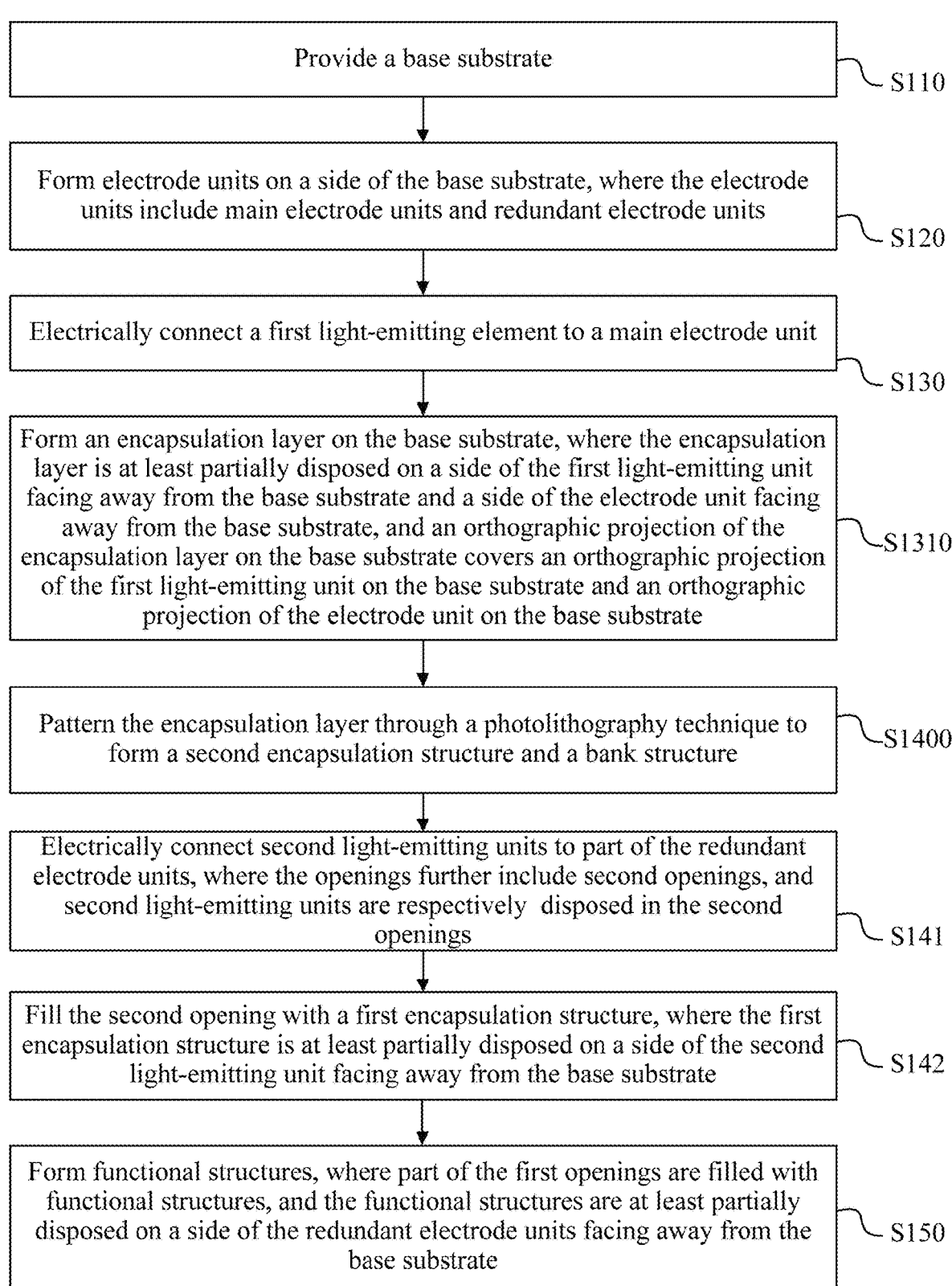
FIG. 7 is a flowchart of another preparation method of a display panel according to an embodiment of the present disclosure.
Figure 8:
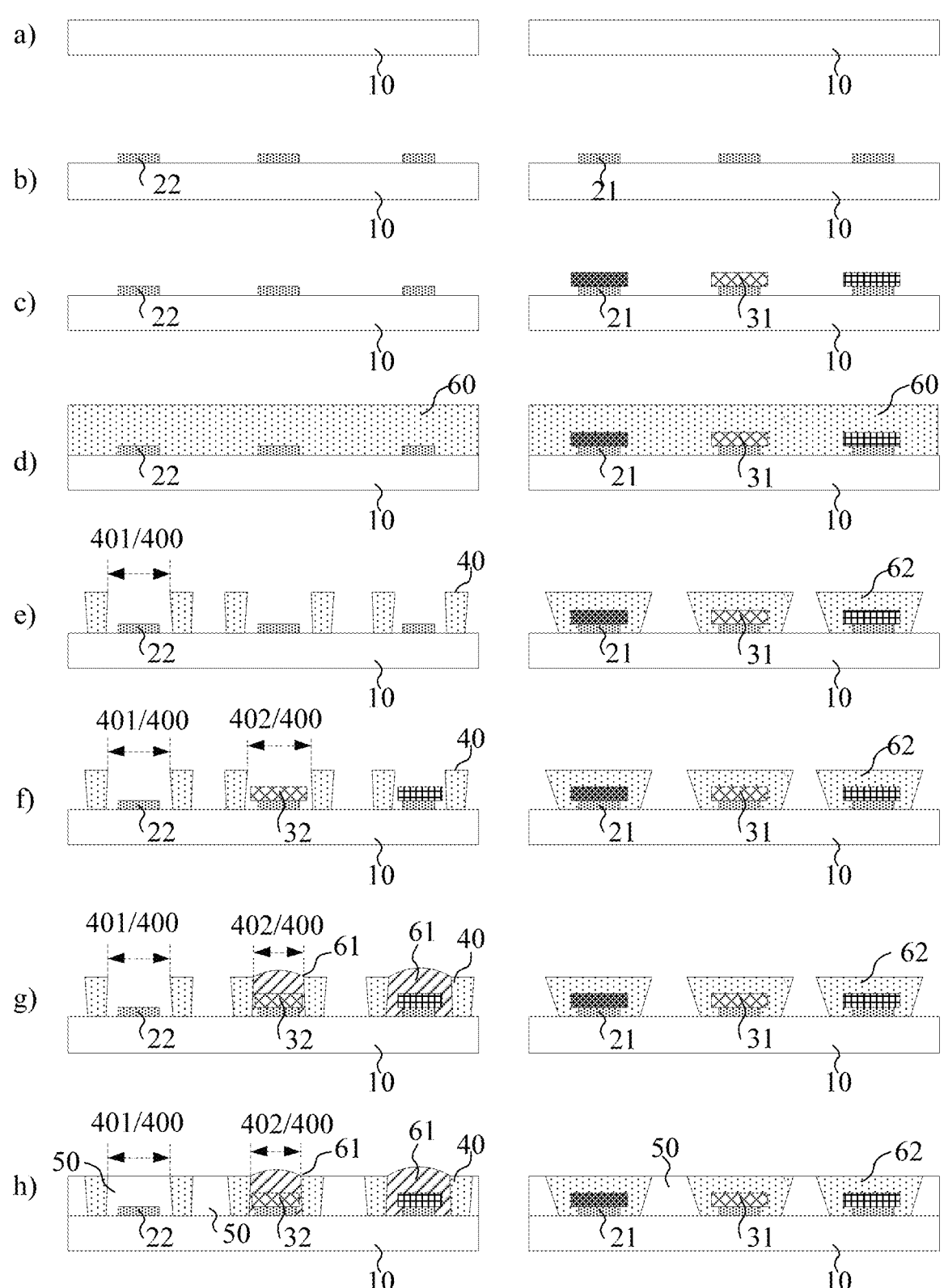
FIG. 8 is a structural flowchart of the preparation method of the display panel shown in FIG. 7.

However, the present disclosure further provides a simpler manner to prepare the bank structure and the second encapsulation structure. FIG. 7 is a flowchart of another preparation method of a display panel according to the embodiment of the present disclosure. FIG. 8 is a structural flowchart of the preparation method of the display panel shown in FIG. 7. Based on the preparation method provided by the preceding embodiment, comparing FIGS. 4 and 5 with FIGS. 7 and 8, step S131 and step S140 may be simultaneously performed for the preparation and formation in the same process step, that is, the preceding step S131 and step S140 may be replaced with the two sub-steps described below:

In S1310, an encapsulation layer is formed on the base substrate, where the encapsulation layer is at least partially disposed on the side of the first light-emitting unit facing away from the base substrate and a side of the electrode unit facing away from the base substrate, and an orthographic projection of the encapsulation layer on the base substrate covers the orthographic projection of the first light-emitting unit on the base substrate and an orthographic projection of the electrode unit on the base substrate.

In S1400, the encapsulation layer is patterned through the photolithography technique so that the second encapsulation structure and the bank structure are formed.

Based on this, referring to FIG. 7, figure d) in FIG. 7 shows the process of forming the encapsulation layer 60 on the base substrate and shows the process of coating the whole adhesive layer. Figure e) in FIG. 7 shows the process in which the encapsulation layer 60 is patterned through the photolithography technique according to the positions of the main electrode units 21 and the positions of the redundant electrode units 22 to synchronously form the second encapsulation structures 62 and the bank structures 40. That is, the second encapsulation structures 62 and the bank structures 40 are synchronously formed in the same step, and there is no sequence for forming the second encapsulation structures 62 and the bank structures 40.

It is to be noted that the second encapsulation structures 62 and the bank structures 40 are essentially formed in two steps during the preparation process as shown in FIGS. 4 and 5, and the implementation may be performed through the adhesive layer coating technique and the photolithography patterning technique. Apparently, for the process steps of separately forming the second encapsulation structure 62 and the bank structure 40, it is possible to independently design the shapes, materials, and the like of the second encapsulation structure 62 and the bank structure 40 so as to use the second encapsulation structure 62 and the bank structure 40 for separately performing an independent adjustment in properties such as light emission of the first light-emitting unit 31 and the second light-emitting unit 32 so as to avoid mutual influence. During the preparation process shown in FIGS. 7 and 8, the second encapsulation structures 62 and the bank structures 40 are formed synchronously by the same process step, which can save the steps and masks and reduce time and material costs.

It is to be emphasized that the bank structures 40 and the second encapsulation structures 62 need to be exposed by thinning since the functional structures 50 is prepared through the technique of coating and thinning the whole layer in the embodiment of the present disclosure. Since the thinning technique has an action on the whole panel, the bank structures 40 and the second encapsulation structures 62 made of a relatively soft material are simultaneously thinned. Therefore, in an actual display panel, the upper surface of the bank structure 40 and the upper surface of the second encapsulation structure 62 remain at the same height on the base substrate 10, that is, the distance from the surface of the side of the second encapsulation structure 62 facing away from the base substrate 10 to the base substrate 10 is equal to the distance from the surface of the side of the bank structure 40 facing away from the base substrate 10 to the base substrate 10.

Thus, in the preparation method provided by the embodiment of the present disclosure, step S150 may include the steps described below.

In S151, the functional structure adhesive layer is attached, in a heated vacuum environment, to a side of the base substrate on which the bank structure is disposed, where an orthographic projection of the functional structure adhesive layer on the base substrate covers orthographic projections of the bank structures, the opening between bank structures, and the first encapsulation structures on the base substrate.

Here, for the step of making the adhesive layer adhere, reference may be made to the preceding description. The details are not repeated here.

In S152, the functional structure adhesive layer is thinned through an ash technique or a wet etching technique so that the functional structure is formed.

In an embodiment, step S152 may be the process in which the ash is performed on the whole surface or the whole is immersed in a solution for performing the wet etching. An excessive functional structure adhesive material layer covering the bank structure 40 may be removed through the ash and the wet etching and the first encapsulation structure 61 and the second encapsulation structure 62 may be exposed at the same time, thereby ensuring the light emission of the light-emitting units inside the first encapsulation structure 61 and the second encapsulation structure 62.

Of course, considering an error in the thinning technique and a rough surface formed in the thinning technique, there may be certain errors in the height of the upper surface of the second encapsulation structure 62 and the height of the upper surface of the bank structure 40, or there may be certain errors in the height of a local region on the upper surface of the second encapsulation structure 62 and the height of a local region on the upper surface of the bank structure 40. It is defined here that the upper surface of the bank structure 40 and the upper surface of the second encapsulation structure 62 may be considered to remain at the same height on the base substrate 10 if the range of errors is within 30%.

It is also to be noted that the second encapsulation structure 62 needs to transmit the light emitted from the first light-emitting unit 31 inside the second encapsulation structure 62 to the outside, and the first encapsulation structure 61 needs to transmit the light emitted from the second light-emitting unit 32 inside the first encapsulation structure 61 to the outside. To avoid differences in the light emission between the two light-emitting units due to different encapsulation structures, optionally, the first encapsulation structure 61 and the second encapsulation structure 62 may be made of materials having the same or similar refractive index, thereby eliminating differences in light types between the two light-emitting units.

Figure 9:
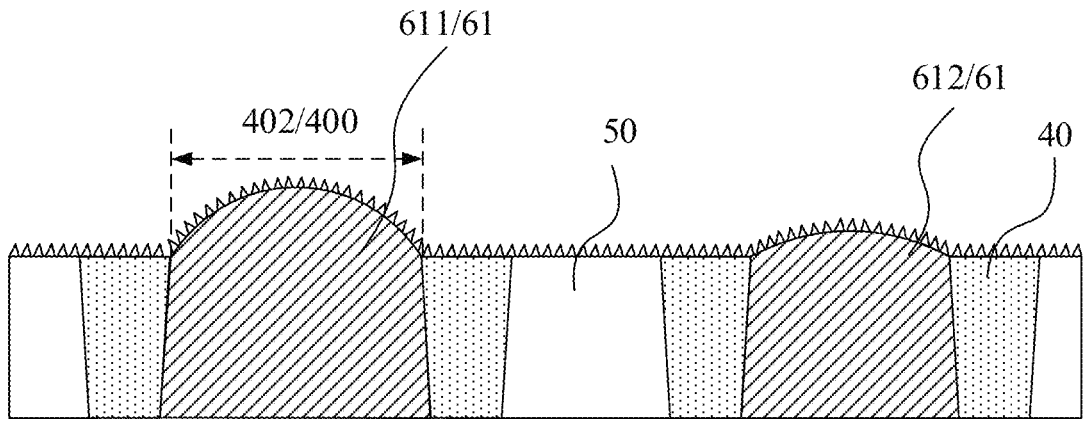
FIG. 9 is a partial enlarged view of dashed box a of the display panel shown in FIG. 2.
Figure 10:
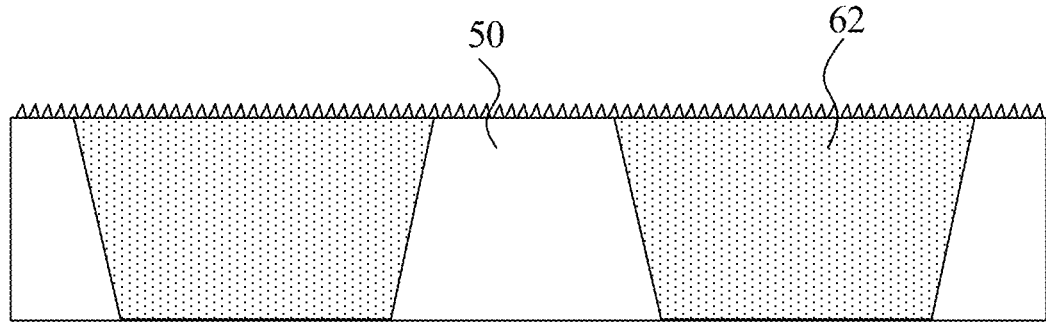
FIG. 10 is a partial enlarged view of dashed box b of the display panel shown in FIG. 3.

Further, FIG. 9 is a partial enlarged view of dashed box a of the display panel shown in FIG. 2, and FIG. 10 is a partial enlarged view of dashed box b of the display panel shown in FIG. 3. Referring to FIGS. 9 and 10, based on the preceding thinning technique, in a display panel actually formed, at least part of the surface of the side of the bank structure 40 facing away from the base substrate 10 is a rough concave-convex surface and at least part of the surface of a side of the second encapsulation structure 62 facing away from the base substrate 10 is a rough concave-convex surface.

The bank structures 40, the second encapsulation layers 62, and the first encapsulation structures 61 are exposed while the functional structure adhesive layer is thinned through the thinning technique. In addition, the upper surfaces of the bank structures 40, the second encapsulation structures 62, and the first encapsulation structures 61 which are exposed, that is, the surfaces of the sides facing away from the base substrate 10, are roughened, thereby implementing diffuse reflection, helping avoid specular reflection after the external light is incident on the display panel, and further reducing the reflectivity of the display panel. For the first encapsulation structure 61, the roughened surface also helps reduce the probability of the total reflection of the light in the first encapsulation structure 61 at an interface, thereby increasing the light emitted from the internal light-emitting unit to the outside and improving the light extraction efficiency of the internal light-emitting unit.

Further, as described in the preceding steps S1310 and S1400, in the embodiment of the present disclosure, the bank structures 40) and the second encapsulation structures 62 described above may optionally be made of the same material in the same technique, that is, the bank structures 40 and the second encapsulation structures 62 are the same material. During the preparation of the second encapsulation structures 62 as described above, the bank structures 40) may be formed. In an embodiment, the whole encapsulation adhesive layer is coated on the base substrate 10, and the encapsulation adhesive layer is patterned through the etching technique, and an opening pattern of the second encapsulation structures 62 and an opening pattern of the bank structures 40 are designed in the mask used for the patterning, the whole encapsulation adhesive layer may be etched with the mask to form the second encapsulation structures 62 covering the first light-emitting units 31 and the bank structures 40 enclosing the redundant electrode units 22.

Further, with continued reference to FIG. 3, in this display panel, the second encapsulation structure 62 includes a third side surface 623 and a first surface 621, the third side surface 623 is disposed on a side of the second encapsulation structure 62 along a first direction 1, and the first direction 1 is parallel to a plane in which the base substrate 10 is located: in a direction perpendicular to the plane in which the base substrate 10 is located, the first surface 621 is disposed on a side of the second encapsulation structure 62 facing away from the base substrate 10; and an included angle α3 between the third side surface 623 and the first surface 621 is a third included angle, where the third included angle α3 is an acute angle.

In the embodiment of the present disclosure, the encapsulation adhesive layer may be patterned through the photolithography technique when the second encapsulation structure is prepared, where negative photoresist is optionally used. It is to be known by those skilled in the art that the property of photoresist in an exposed region is changed and the photoresist is cured when the negative photoresist is used, the encapsulation adhesive layer in the cured region is retained during development, and the bottom of the cured region is etched more seriously than the top of the cured region due to the over-etching effect of a developer so that the retained encapsulation adhesive layer, that is, the second encapsulation structure 62, has an inverted platform-like structure. Here, the third side surface 623 is essentially an inclined sidewall of the second encapsulation structure 62 as an inverted platform-like structure. The first surface 623 is essentially a relatively large-area bottom surface of the second encapsulation structure 62 as the inverted platform-like structure, which may also be understood as the upper surface of the inverted platform-like structure. Based on the actual preparation technique, the included angle between the third side surface 623 and the first surface 621 of the second encapsulation structure 62 in the embodiment of the present disclosure, that is, the third included angle α3, is essentially a top vertex angle of the inverted platform-like structure. The third included angle α3 is the acute angle, which indicates that the sidewall of the second encapsulation structure 62 inclines outward in the upward direction perpendicular to the base substrate 10. That is, the upper surface of the second encapsulation structure 62 has a larger area than the lower surface of the second encapsulation structure 62, which indicates that the second encapsulation structure 62 is the inverted platform-like structure.

Referring to a light path as shown in FIG. 3, it can be seen that the light emitted from the first light-emitting unit 31 is reflected upward by the third side surface 623 when incident on the sidewall, that is, the third side surface 623, since the inverted platform-like second encapsulation structure 62 has the sidewall inclining outward. That is, the second encapsulation structure 62 is properly designed to make the second encapsulation structure 62 form the inverted platform-like structure so that the light emitted from the light-emitting unit encapsulated in the second encapsulation structure 62 can be emitted to the front of the display panel as much as possible by the inclined sidewall of the second encapsulation structure 62, thereby improving the light extraction efficiency of the first light-emitting unit.

Figure 11:
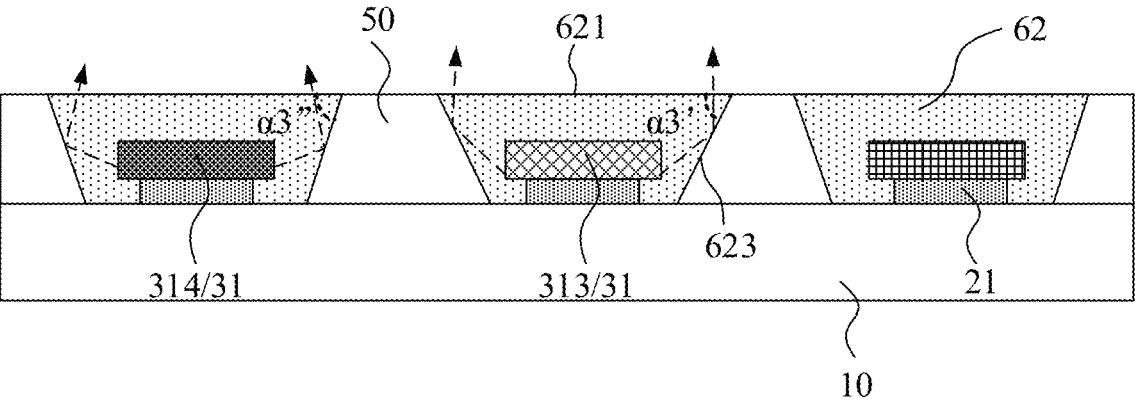
FIG. 11 is a sectional view of another display panel according to an embodiment of the present disclosure.

Similarly, considering that the light-emitting units of the different colors may have the inconsistent light emission efficiencies, the second encapsulation structure may optionally be designed differently in the embodiment of the present disclosure so that the first light-emitting units of the different colors have the relatively balanced light extraction efficiencies. FIG. 11 is a sectional view of another display panel according to an embodiment of the present disclosure. Referring to FIG. 11, in another embodiment of the present disclosure, the first light-emitting unit 31 includes a third-color light-emitting unit 313 and a fourth-color light-emitting unit 314; and a wavelength of light emitted from the third-color light-emitting unit 313 is greater than a wavelength of light emitted from the fourth-color light-emitting unit 314. A third included angle α3' of the second encapsulation structure 62 on a side of the third-color light-emitting unit 313 facing away from the base substrate 10 is smaller than a third included angle α3" of the second encapsulation structure 62 on a side of the fourth-color light-emitting unit 314 facing away from the base substrate 10.

It can be seen from the preceding description that the third-color light-emitting unit 313 and the fourth-color light-emitting unit 314 here may be similarly understood as the red light-emitting unit and the green light-emitting unit, respectively. In comparison, the red light-emitting unit has the relatively low light emission efficiency. In this embodiment, the third included angle α3' of the second encapsulation structure 62 covering the red light-emitting unit is set relatively small. Actually, the sidewall of the second encapsulation structure 62 is set more inclined, and the inclination angle is closer to 45 degrees. Referring to a light path shown in FIG. 11, it is to be understood that when the inclination degree of the sidewall is closer to 45 degrees, light emitted from the red light-emitting unit horizontally may be emitted to the upward direction perpendicular to the base substrate 10 through the sidewall. The sidewalls of the second encapsulation structures corresponding to the light-emitting units of the different colors are set to have the different inclination angles so that the light-emitting unit having the relatively low light emission efficiency can emit more light to the front of the display panel, thereby achieving the effects of equalizing the amount of light emitted from the light-emitting units of the different colors and reducing the brightness difference between the light-emitting units of the different colors.

Figure 12:
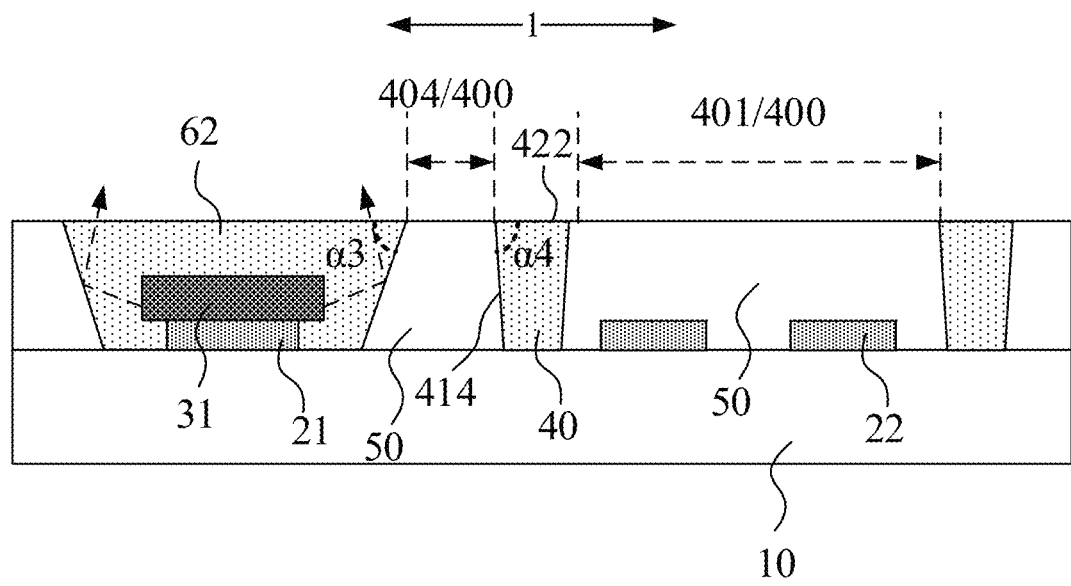
FIG. 12 is a sectional view of the display panel shown in FIG. 1 taken along CC'.

Since the bank structure and the second encapsulation structure are actually made through the same technique, that is, the photolithography technique during the preparation, the bank structure may also have an inverted platform-like structure based on the same principle. In an embodiment. FIG. 12 is a sectional view of the display panel shown in FIG. 1 taken along CC'. Referring to FIGS. 1 and 12, the bank structure 40 includes a fourth side surface 414 and a second surface 422, the fourth side surface 414 is disposed on a side of the bank structure 40 along the first direction 1, and in the direction perpendicular to the plane in which the base substrate 10 is located, the second surface 422 is disposed on the side of the bank structure 40 facing away from the base substrate 10; and an included angle between the fourth side surface 414 and the second surface 422 is a fourth included angle α4, where the third included angle α3 is smaller than the fourth included angle α4, and the fourth angle α4 is the acute angle. The fourth side surface 414 is essentially an inclined sidewall of the bank structure 40 as the inverted platform-like structure. The second surface 422 is essentially a relatively large-area bottom surface of the bank structure 40 as the inverted platform-like structure, which may also be understood as the upper surface of the inverted platform-like structure. Similarly, the included angle between the fourth side surface 414 and the second surface 422 of the bank structure 40 here, that is, the fourth included angle α4, is essentially a top vertex angle of the inverted platform-like structure. The fourth included angle α4 is the acute angle, which indicates that the sidewall of the bank structure 40 inclines outward in the upward direction perpendicular to the base substrate 10. That is, the upper surface of the bank structure 40 has a larger area than the lower surface of the bank structure 40, which indicates that the bank structure 40 is the inverted platform-like structure.

In addition, since a spacing between adjacent second encapsulation structures 62 is larger than a spacing between adjacent bank structures 40, an adhesive in a gap between the second encapsulation structures 62 with the relatively large spacing is over-etched more seriously during the development and the etching when the second encapsulation structures 62 and the bank structures 40) are prepared. That is, an etching solution etches more the bottom of the second encapsulation structure 62 so that the bottom surface of the second encapsulation structure 62 formed after the development finally has a smaller area than the bottom surface of the bank structure 40). The sidewall of the second encapsulation structure 62 is relatively more inclined. As shown in FIG. 9, the third included angle α3 of the second encapsulation structure 62 is smaller than the fourth included angle α4 of the bank structure 40.

Figure 13:
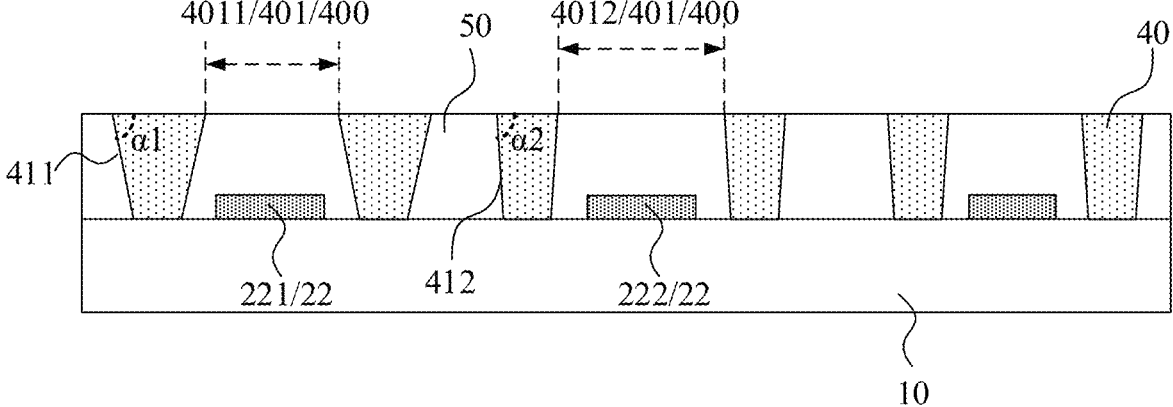
FIG. 13 is a sectional view of another display panel according to an embodiment of the present disclosure.

FIG. 13 is a sectional view of another display panel according to an embodiment of the present disclosure. Referring to FIGS. 1 and 13, in another embodiment of the present disclosure, the first opening 401 may be set to include a first sub-opening 4011 and a second sub-opening 4012, and a bank structure 40) includes a first side surface 411 facing away from the first sub-opening 4011 and another bank structure 40) includes a second side surface 412 facing away from the second sub-opening 4012; and an included angle between the first side surface 411 and the surface of the side of the bank structure 40 facing away from the base substrate 10 is a first included angle α1, and an included angle between the second side surface 412 and the surface of the side of the bank structure 40 facing away from the base substrate 10 is a second included angle α2, where one of the first included angle α1 and the second included angle α2 is greater than the other.

Here, the first opening 401 is set to include two types of sub-openings, which sets the bank structures 40 enclosing the two types of sub-opening different. In an embodiment, the side surface of the bank structure 40 facing away from the first sub-opening 4011, that is, the first side surface 411, refers to the side surface of the bank structure 40 facing away from the first sub-opening 4011 in a direction parallel to the base substrate 10. Similarly, the side surface of the bank structure 40 facing away from the second sub-opening 4012, that is, the second side surface 412, refers to the side surface of the bank structure 40 facing away from the second sub-opening 4012 in the direction parallel to the base substrate 10. Here, the included angle between the first side surface 411 and the surface of the side of the bank structure 40 facing away from the base substrate 10, that is, the upper surface, is set to be the first included angle α1, and the included angle between the second side surface 412 and the surface of the side of the bank structure 40) facing away from the base substrate 10, that is, the upper surface, is set to the second included angle α2, and one of the first included angle α1 and the second included angle α2 is set to be greater than the other. Essentially, the two side surfaces of the bank structures 40 are set to have the different inclination angles so that the light extraction efficiencies of the adjacent light-emitting units are adjusted through the reflection by the side surfaces, thereby meeting the requirement of the display panel for the light emission of the light-emitting units.

With continued reference to FIGS. 1 and 13, further, the redundant electrode units 22 includes a first redundant electrode unit 221 and a second redundant electrode unit 222. The first redundant electrode unit 221 is disposed in the first sub-opening 4011, and the second redundant electrode unit 222 is disposed in the second sub-opening 4012: the first light-emitting unit 31 includes the third-color light-emitting unit 313 and the fourth-color light-emitting unit 314; and the first redundant electrode unit 221 corresponds to a first pixel circuit (not shown in the figure), the second redundant electrode unit 222 corresponds to a second pixel circuit (not shown in the figure), the first pixel circuit drives the third-color light-emitting unit 313, and the second pixel circuit drives the fourth-color light-emitting unit 314. The first included angle α1 is smaller than the second included angle α2, and a wavelength of the light emitted from the third-color light-emitting unit 313 is greater than a wavelength of the light emitted from the fourth-color light-emitting unit 314.

First, it is to be understood that the main electrode unit 21 is responsible for electrically connecting the pixel circuit to the main light-emitting unit and driving the first light-emitting unit to be bright through the pixel circuit. When the first light-emitting unit emits light abnormally, the redundant electrode unit 22, as a standby electrode for the main electrode unit 21, is bonded to a new light-emitting unit so that the pixel circuit is electrically connected to the main light-emitting unit, and the new pixel circuit is used for driving the new light-emitting unit to be bright. Thus, it is to be understood that one main electrode unit 21 and one redundant electrode unit 22 share the same pixel circuit, that is, correspond to the same pixel circuit.

In this embodiment, according to the light-emitting units of the two colors included in the first light-emitting unit, that is, the third-color light-emitting unit 313 and the fourth-color light-emitting unit 314, the two pixel circuits corresponding to the third-color light-emitting unit 313 and the fourth-color light-emitting unit 314 are defined as the first pixel circuit and the second pixel circuit, respectively. Further, according to the first pixel circuit and the second pixel circuit, the two redundant electrode units 22 corresponding to the first pixel circuit and the second pixel circuit are defined as the first redundant electrode unit 221 and the second redundant electrode unit 222, respectively. In this embodiment, the first sub-opening 4011 and the second sub-opening 4012 differ mainly in the redundant electrode units 22 therein. The first redundant electrode unit 221 is in the first sub-opening 4011, and the second redundant electrode unit 222 is in the second sub-opening 4012. The first redundant electrode unit 221 differs from the second redundant electrode unit 222 mainly in that the first light-emitting unit 31 corresponding to the first redundant electrode unit 221 as a standby electrode is different from the first light-emitting unit 31 corresponding to the second redundant electrode unit 222 as a standby electrode.

Based on the preceding logic, it can be seen that the first sub-opening 4011 actually corresponds to the third-color light-emitting unit 313 and the second sub-opening 4012 corresponds to the fourth-color light-emitting unit 314. As described in the preceding embodiment, the third-color light-emitting unit 313 and the fourth-color light-emitting unit 314 may be understood as the red light-emitting unit and the green light-emitting unit, respectively. In comparison, the red light-emitting unit has the relatively low light emission efficiency. In this embodiment, the included angle between the first side surface 411 and the upper surface of the bank structure 40, that is, the first included angle $\alpha 1$, is set relatively small for the red light-emitting unit while the included angle between the second side surface 412 and the upper surface of the bank structure 40, that is, the second included angle $\alpha 2$, is set relatively large for the green light-emitting unit. Actually, the first side surface 411 is set to have a smaller inclination angle than the second side surface 412 such that the inclination angle of the first side surface 411 is closer to 45 degrees. Thus, the light emitted from the red light-emitting unit, that is, the third-color light-emitting unit 313, is reflected by the first side surface 411 and more emitted in the upward direction perpendicular to the base substrate 10 so that the light-emitting unit having the relatively low light emission efficiency emits more light to the front of the display panel, thereby achieving the effects of equalizing the amount of light emitted from the light-emitting units of the different colors and reducing the brightness difference between the light-emitting units of the different colors.

It is to be noted that the second light-emitting units 32 may be disposed in the bank structures 40 corresponding to the first sub-opening 4011 and the second sub-opening 4012 here, or no second light-emitting units 32 may be disposed in the bank structures 40 corresponding to the first sub-opening 4011 and the second sub-opening 4012. It is to be understood that a magnitude relationship between the first included angle $\alpha 1$ and the second included angle $\alpha 2$ is preset when the bank structures 40 are prepared so that when the second light-emitting unit 32 is disposed in the first sub-opening 4011 or the second sub-opening 4012 if the first light-emitting unit 31 fails, the inclined sidewall of the bank structure 40 can be used for reflecting the light emitted from the second light-emitting unit 32. Thus, the light emitted from the second light-emitting unit 32 is more emitted to the front of the display panel, thereby improving the light extraction efficiency of the second light-emitting unit 32.

With continued reference to FIGS. 1 and 2, optionally, at least two bank structures 40 are provided between adjacent redundant electrode units 22, the opening 400 between the adjacent bank structures 40 includes a third opening 403, and part of the functional structures 50 fill the third opening 403.

Here, the at least two bank structures 40 are disposed between the adjacent redundant electrode units 22. Thus, on the one hand, each redundant electrode unit 22 has an independent bank structure 40) around it, and on the other hand, the at least two bank structures 40 between the two adjacent redundant electrode units 22 may be filled to form the functional structure 50. Here, the functional structure 50 in the third opening 403 is essentially disposed on the surface of the side of the base substrate 10 on which the electrode units are disposed, and the functional structure 50 directly covers the base substrate 10. With this functional structure 50, the light emitted from the second light-emitting unit 32 can be extracted when the second light-emitting unit 32 is bonded on the redundant electrode unit 22. Thus, the light emitted from the second light-emitting unit 32 at a large angle is emitted to the outside to a certain extent, thereby improving the light extraction efficiency of the second light-emitting unit 32 and helping increase the brightness of the display panel.

With continued reference to FIGS. 1 and 12, optionally, the display panel further includes a fourth opening 404, where at least one sidewall of the fourth opening 404 is the sidewall of the second encapsulation structure 62, and the fourth opening 404 is filled with part of the functional structures 50.

The at least one sidewall of the fourth opening 404 is the sidewall of the second encapsulation structure 62, which actually refers to that a gap exists between the bank structure 40 and the second encapsulation structure 62 to form the fourth opening 404. The functional structure 50 fills the gap between the bank structure 40 and the second encapsulation structure 62, that is, the fourth opening 404. Thus, the light emitted from the first light-emitting unit 31 at the large angle in the second encapsulation structure 62 can be extracted through the functional structure 50) so that the amount of light emitted from the first light-emitting unit 31 at the large angle can be increased and the light extraction efficiency of the first light-emitting unit 31 is improved to some extent, thereby helping increase the brightness of the display panel.

Figure 14:
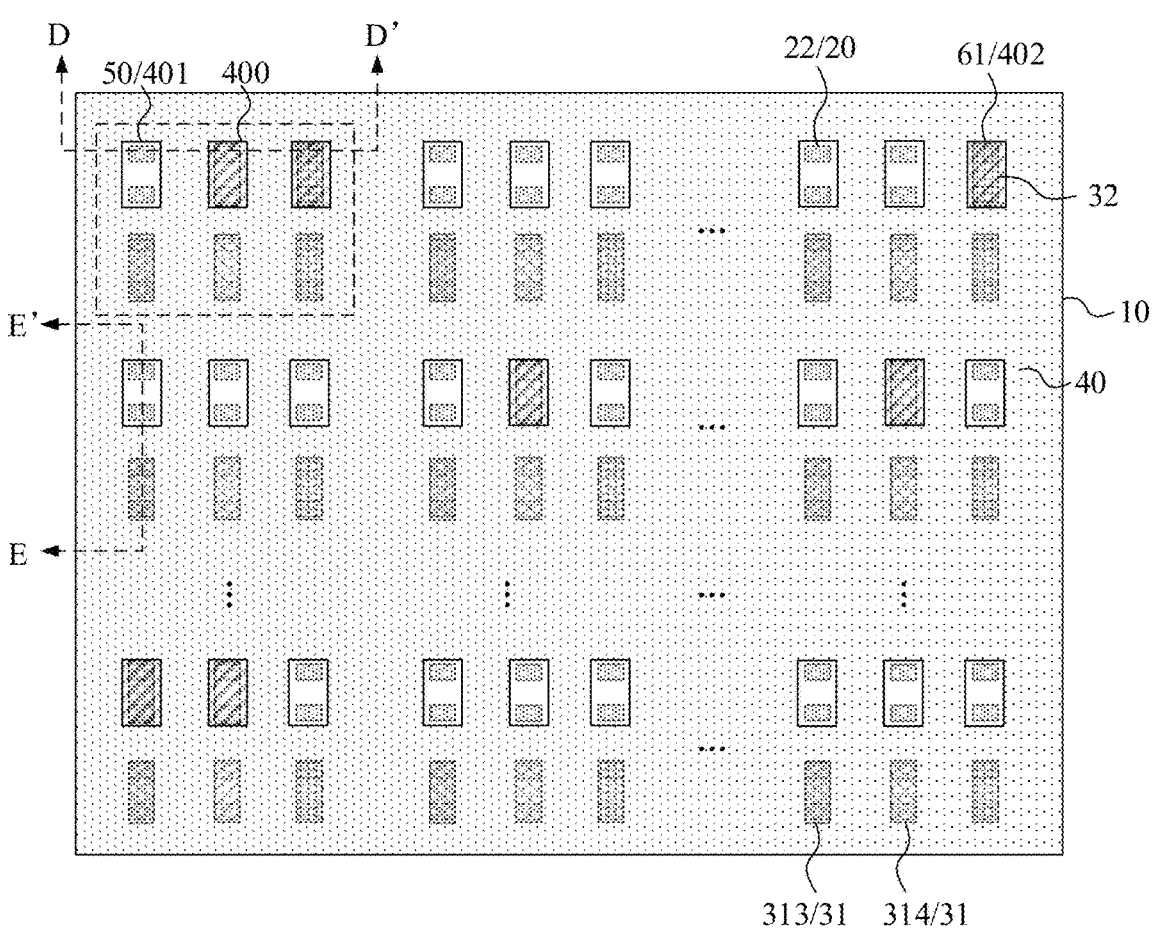
FIG. 14 is a structural diagram of another display panel according to an embodiment of the present disclosure.
Figure 15:
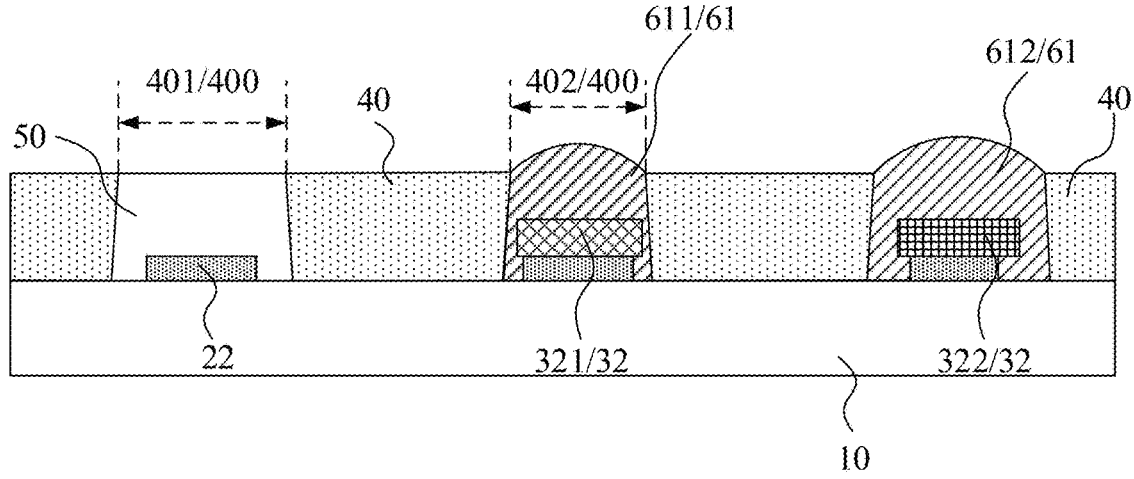
FIG. 15 is a sectional view of the display panel shown in FIG. 14 taken along DD'.

FIG. 14 is a structural diagram of another display panel according to an embodiment of the present disclosure. FIG. 15 is a sectional view of the display panel shown in FIG. 14 taken along DD'. Referring to FIGS. 14 and 15, in another embodiment of the present disclosure, optionally, one bank structure 40 is provided between the adjacent redundant electrode units 22. In this case, the adjacent redundant electrode units 22 share one bank structure 40 and are separated by the bank structure 40, and regions in which the redundant electrode units 22 are disposed are defined. According to this implementation, the number of bank structures 40 can be reduced, and a spacing between the bank structures 40 is relatively large. During the actual preparation, the mask used for the photolithography has a relatively few openings and the requirement for the accuracy of the opening is low; which is more convenient for the preparation. On the contrary, this embodiment is more applicable to a display panel with a height resolution, and a spacing between redundant electrode units in the display panel with the height resolution is relatively small. Therefore, it is more applicable to dispose one bank structure directly between adjacent redundant electrode units.

Figure 16:
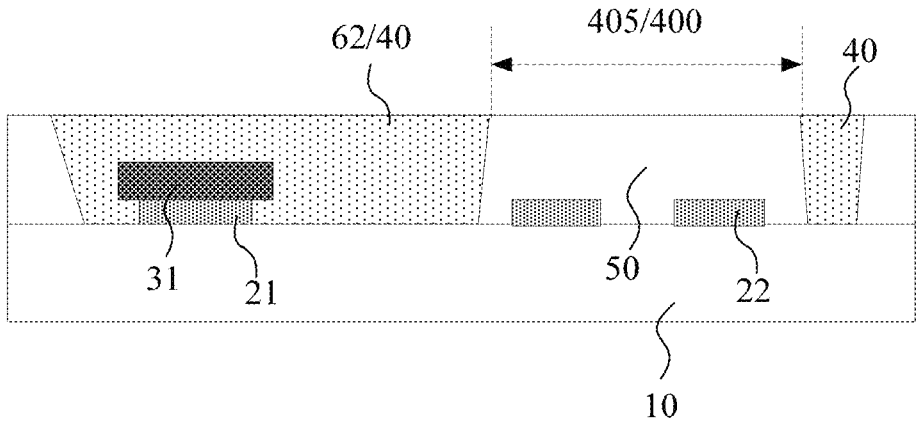
FIG. 16 is a sectional view of the display panel shown in FIG. 14 taken along EE'.

FIG. 16 is a sectional view of the display panel shown in FIG. 14 taken along EE'. Referring to FIGS. 14 and 16, the display panel further includes a fifth opening 405, where at least one sidewall of the fifth opening 405 is the sidewall of the second encapsulation structure 62, at least one sidewall of the fifth opening 405 is the sidewall of the bank structure 40, and part of the redundant electrode units 22 are disposed in the fifth opening 405.

Here, the at least one sidewall of the fifth opening 405 is the sidewall of the second encapsulation structure 62, and the at least one sidewall of the fifth opening 405 is the side wall of the bank structure 40. Essentially, the second encapsulation structure 62 is also used as the bank structure 40 of the redundant electrode units 22 adjacent to the second encapsulation structure 62. The second encapsulation structure 62, in conjunction with another bank structure 40, can limit a region in which the adjacent redundant electrode units 22 are disposed, which is convenient for filling with the functional structure or filling with the first encapsulation structure after the second light-emitting unit 32 is bonded on the redundant electrode unit 22.

As described above, a material may be selected for the functional structure in the embodiment of the present disclosure according to the actually required function. In an embodiment, the functional structure 50 in the embodiment of the present disclosure may be made of a light-shielding material. In an embodiment, the light-shielding material may be a black adhesive having a thickness within 10 μm and transmittance of less than 6%. Alternatively, the functional structure 50 may be made of a light-reflecting material. In an embodiment, the light-reflecting material may be the white adhesive, and its reflectivity should be greater than 80%. In addition, the functional structure 50 may be made of the gray adhesive which implements the functions of reducing the reflection and increasing the light emission. The gray adhesive should have transmittance less than 30% and reflectivity greater than 50%.

When the functional structure 50 is made of the black adhesive, the transmittance is less than 6%, which indicates that the functional structure 50 has a great light absorption ability and can absorb light incident from the outside, thereby preventing the external light from being incident on the redundant electrode unit 22 to form the reflection and achieving the effect of reducing the reflection. When the functional structure 50 is made of the white adhesive, the functional structure 50 has the reflectivity greater than 80% and can reflect the light emitted from the light-emitting unit to the inside of the functional structure 50 to the outside, thereby improving the light extraction efficiency of the light-emitting unit. Of course, the functional structure 50 may be made of the gray adhesive. In this case, the functional structure 50 has the transmittance less than 30% and the reflectivity greater than 50% so that the external incident light can be absorbed and the light which is emitted from the light-emitting unit and incident into the functional structure 50) can be emitted to the outside. Thus, the functional structure 50 has the functions of reducing the reflection of the external light and improving the light extraction efficiency of the light-emitting unit.

Figure 17:
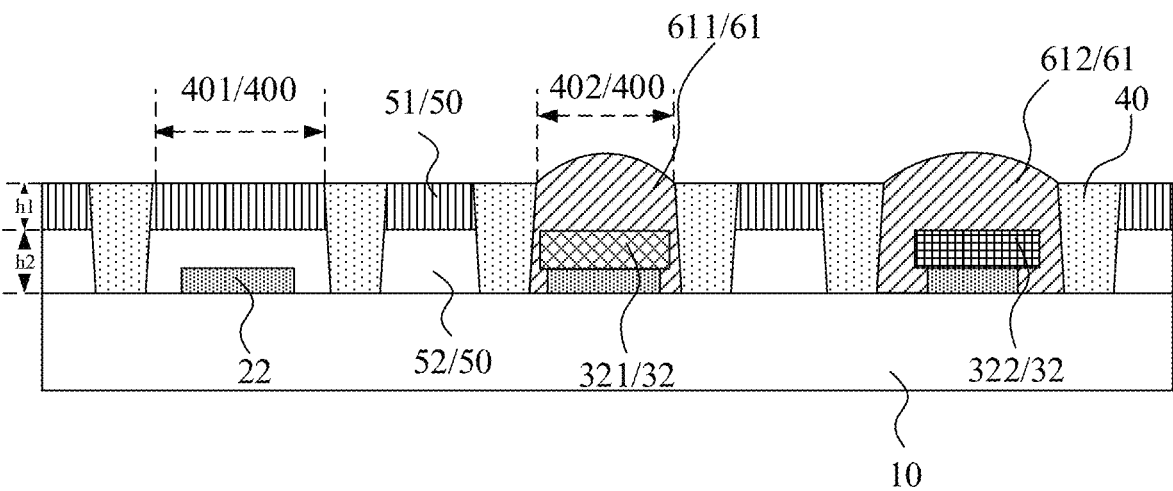
FIG. 17 is a sectional view of another display panel according to an embodiment of the present disclosure.

FIG. 17 is a sectional view of another display panel according to an embodiment of the present disclosure. Referring to FIG. 17, in other embodiments of the present disclosure, the functional structure 50) may also be set to include a first functional layer 51 and a second functional layer 52, where the first functional layer 51 is disposed on a side of the second functional layer 52 facing away from the base substrate 10. The first functional layer 51 satisfies T1<6%, and the second functional layer 52 satisfies R2>80%, where T1 is the transmittance of the first functional layer 51 and R2 is the reflectivity of the second functional layer 52.

The first functional layer 51 is disposed on the side of the second functional layer 52 facing away from the base substrate 10, that is, the first functional layer 51 is disposed on the second functional layer 52. The first functional layer 51 in the upper layer has the transmittance less than 6%, which indicates that the first functional layer 51 has good light absorption performance and can effectively block the external light so as to prevent the external light from continuing to be incident on the redundant electrode unit 22. If the second functional layer 52 in the lower layer has the reflectivity greater than 80%, the light emitted from the light-emitting unit adjacent to the second functional layer 52 can be transmitted inside the second functional layer 52, which is helpful for the light to be emitted from the bank structure to the outside, thereby increasing the light extraction efficiency of the light-emitting unit. Apparently, according to this setting manner, the two functional layers are used for respectively achieving the effects of reducing the reflection and increasing the light emission, thereby improving the display effect of the display panel as a whole.

In an embodiment, the thickness h1 of the preceding first functional layer 51 may be set to 3 μm to 5 μm, and the thickness h2 of the second functional layer 52 may be set to 5 μm to 7 μm. Considering that the bank structure has the limited height, the thickness of the functional structure filling the opening of the bank structure is also limited. In this embodiment, the first functional layer 51 of 3 μm to 5 μm is disposed, which can ensure that the light incident from the outside is sufficiently absorbed and effectively prevents the external light from being incident on the redundant electrode unit to avoid the reflection. The second functional layer 52 of 5 μm to 7 μm is disposed, and a relatively wide horizontal light transmission channel can be formed so that large-angle light of the light-emitting unit is transmitted through the channel and then is emitted from the bank structure to the outside, thereby improving the light extraction efficiency of the light-emitting unit.

Figure 18:
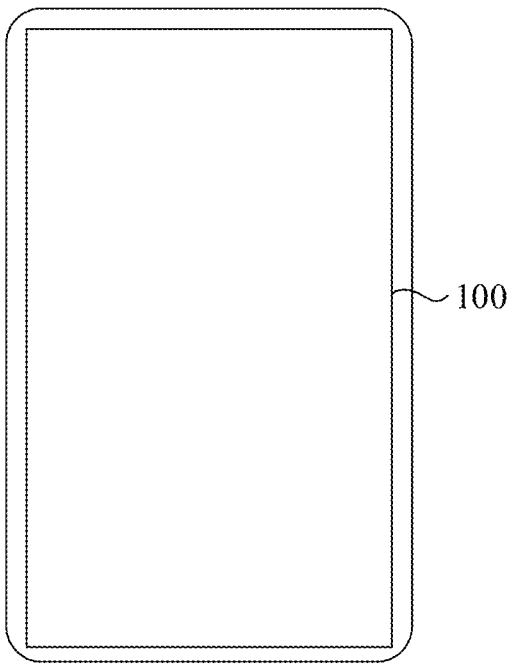
FIG. 18 is a structural diagram of a display device according to an embodiment of the present disclosure.

Based on the same inventive concept, the embodiments of the present disclosure further provide a display device. FIG. 18 is a structural diagram of a display device according to an embodiment of the present disclosure. Referring to FIG. 18, the display device may include the display panel 100 in any one of the embodiments. Since the display panel 100 in the preceding embodiment is used for preparing the display device provided in the embodiment of the present disclosure, the display device has the same or similar technical effects as the display panel provided in the embodiment of the present disclosure. The details are not repeated here. For example, the display device may be an electronic device such as a mobile phone, a computer, a smart wearable device (such as a smart watch), or an onboard display device, which is not limited in the embodiment of the present disclosure.

It is to be noted that the preceding are only preferred embodiments of the present disclosure and the technical principles used therein. It is to be understood by those skilled in the art that the present disclosure is not limited to the embodiments described herein. For those skilled in the art, various apparent modifications, adaptations, combinations, and substitutions can be made without departing from the scope of the present disclosure. Therefore, while the present disclosure has been described in detail via the preceding embodiments, the present disclosure is not limited to the preceding embodiments and may include more equivalent embodiments without departing from the inventive concept of the present disclosure. The scope of the present disclosure is determined by the scope of the appended claims.

What is claimed is:

1. A display panel, comprising:
   a base substrate;
   electrode units disposed on a side of the base substrate, wherein the electrode units comprise a main electrode unit and redundant electrode units;
   a first light-emitting unit electrically connected to the main electrode unit;
   bank structures;
   openings disposed among the bank structures, and functional structures,
   wherein the openings comprise first openings, and
   wherein for a first opening of the first openings, a redundant electrode unit of the redundant electrode units is disposed in the first opening; and
   wherein for a first opening of a part of the first openings, the first opening is filled with a functional structure of the functional structures, and the functional structure is at least partially disposed on a side of the redundant electrode unit facing away from the base substrate;

wherein at least two bank structures of the bank structures are provided between adjacent redundant electrode units of the redundant electrode units, a third opening is provided between adjacent bank structures of the bank structures, and the third opening is filled with a part of the functional structures;

or the display panel further comprises:

a second encapsulation structure, and at least one of a fourth opening or a fifth opening; wherein the second encapsulation structure is at least partially disposed on a side of the first light-emitting unit facing away from the base substrate, and an orthographic projection of the second encapsulation structure on the base substrate covers an orthographic projection of the first light-emitting unit on the base substrate; for the fourth opening, at least one sidewall of the fourth opening is a sidewall of the second encapsulation structure, and the fourth opening is filled with a part of the functional structures; for the fifth opening, at least one sidewall of the fifth opening is a sidewall of the second encapsulation structure, and at least one sidewall of the fifth opening is a side wall of a bank structure of the bank structures, a part of the redundant electrode units is disposed in the fifth opening, the fifth opening is filled with a part of the functional structures, and the part of the functional structures is at least partially disposed on a side of the part of the redundant electrode units facing away from the base substrate;

or wherein the functional structures comprise a light-shielding material.

2. The display panel according to claim 1, further comprising: a first encapsulation structure and a second light-emitting unit, wherein the openings further comprise a second opening, and the second light-emitting unit is disposed in the second opening; and the second opening is filled with the first encapsulation structure, and the first encapsulation structure is at least partially disposed on a side of the second light-emitting unit facing away from the base substrate.

3. The display panel according to claim 2, wherein the first encapsulation structure comprises a top surface, wherein the top surface is disposed, along a direction perpendicular to a plane in which the base substrate is located, on a side of the first encapsulation structure facing away from the base substrate; and the top surface is an arc surface and protrudes toward a direction away from the base substrate.

4. The display panel according to claim 3, wherein the second light-emitting unit comprises a first-color light-emitting unit and a second-color light-emitting unit, and the first encapsulation structure comprises a first encapsulation sub-structure and a second encapsulation sub-structure, wherein, the first encapsulation sub-structure corresponds to the first-color light-emitting unit, and the second encapsulation sub-structure corresponds to the second-color light-emitting unit;

an area of an orthographic projection of a top surface of the first encapsulation sub-structure on the base substrate is smaller than an area of an orthographic projection of a top surface of the second encapsulation sub-structure on the base substrate; and a wavelength of light emitted from the first-color light-emitting unit is greater than a wavelength of light emitted from the second-color light-emitting unit.

5. The display panel according to claim 3, wherein the second light-emitting unit comprises a first-color light-emitting unit and a second-color light-emitting unit, and the first encapsulation structure comprises a first encapsulation sub-structure and a second encapsulation sub-structure, wherein, the first encapsulation sub-structure corresponds to the first-color light-emitting unit, and the second encapsulation sub-structure corresponds to the second-color light-emitting unit; and a sectional shape of a top surface of the first encapsulation sub-structure on a first plane is a first arc, and a sectional shape of a top surface of the second encapsulation sub-structure on the first plane is a second arc, wherein a radius of curvature corresponding to the first arc is smaller than a radius of curvature corresponding to the second arc, and the first plane is perpendicular to the base substrate.

6. The display panel according to claim 3, wherein in a direction perpendicular to the base substrate, a height difference between the top surface and a surface of a side of the bank structures facing away from the base substrate is less than or equal to 6 μm.

7. The display panel according to claim 1, wherein the first openings comprise a first sub-opening and a second sub-opening, and the bank structures comprise a first side surface facing away from the first sub-opening and a second side surface facing away from the second sub-opening, wherein, an included angle between the first side surface and a surface of a side of the bank structures facing away from the base substrate is a first included angle, and an included angle between the second side surface and a surface of a side of the bank structures facing away from the base substrate is a second included angle, wherein one of the first included angle or the second included angle is greater than another one of the first included angle or the second included angle.

8. The display panel according to claim 7, wherein the redundant electrode units comprise a first redundant electrode unit and a second redundant electrode unit, wherein the first redundant electrode unit is disposed in the first sub-opening, and the second redundant electrode unit is disposed in the second sub-opening:

wherein the first light-emitting unit comprises a third-color light-emitting unit and a fourth-color light-emitting unit, wherein a wavelength of light emitted from the third-color light-emitting unit is greater than a wavelength of light emitted from the fourth-color light-emitting unit; and wherein the first redundant electrode unit corresponds to a first pixel circuit, and the second redundant electrode unit corresponds to a second pixel circuit, wherein the first pixel circuit is configured to drive the third-color light-emitting unit, and the second pixel circuit is configured to drive the fourth-color light-emitting unit; and wherein the first included angle is smaller than the second included angle.

9. The display panel according to claim 1, wherein a distance from a surface of a side of the second encapsulation structure facing away from the base substrate to the base substrate is equal to a distance from a surface of a side of the bank structures facing away from the base substrate to the base substrate.

10. The display panel according to claim 1, wherein the second encapsulation structure comprises a third side surface and a first surface, wherein, the third side surface is disposed on a side of the second encapsulation structure along a first direction, and the first direction is parallel to a plane in which the base substrate is located: in a direction perpendicular to the plane in which the base substrate is located, the first surface is disposed on a side of the second encapsulation structure facing away from the base substrate; and an included angle between the third side surface and the first surface is a third included angle, wherein the third included angle is an acute angle.

11. The display panel according to claim 10, wherein for a bank structure of a part of the bank structures, the bank structure comprises a fourth side surface and a second surface, wherein the fourth side surface is disposed on a side of the bank structure along the first direction: in the direction perpendicular to the plane in which the base substrate is located, the second surface is disposed on a side of the bank structure facing away from the base substrate; and an included angle between the fourth side surface and the second surface is a fourth included angle, the third included angle is smaller than the fourth included angle, and the fourth included angle is an acute angle.

12. A display device, comprising a display panel, wherein the display panel comprises:

a base substrate;

electrode units disposed on a side of the base substrate, wherein the electrode units comprise a main electrode unit and redundant electrode units;

a first light-emitting unit electrically connected to the main electrode unit;

bank structures;

openings disposed among the bank structures, and functional structures, wherein the openings comprise first openings, and wherein for a first opening of the first openings, a redundant electrode unit of the redundant electrode units is disposed in the first opening; and wherein for a first opening of a part of the first openings, the first opening is filled with a functional structure of the functional structures, and the functional structure is at least partially disposed on a side of the redundant electrode unit facing away from the base substrate;

wherein at least two bank structures of the bank structures are provided between adjacent redundant electrode units of the redundant electrode units, a third opening is provided between adjacent bank structures of the bank structures, and the third opening is filled with a part of the functional structures;

or the display panel further comprises:

a second encapsulation structure, and at least one of a fourth opening or a fifth opening: wherein the second encapsulation structure is at least partially disposed on a side of the first light-emitting unit facing away from the base substrate, and an orthographic projection of the second encapsulation structure on the base substrate covers an orthographic projection of the first light-emitting unit on the base substrate; for the fourth opening, at least one sidewall of the fourth opening is a sidewall of the second encapsulation structure, and the fourth opening is filled with a part of the functional structures; for the fifth opening, at least one sidewall of the fifth opening is a sidewall of the second encapsulation structure, and at least one sidewall of the fifth opening is a side wall of a bank structure of the bank structures, a part of the redundant electrode units is disposed in the fifth opening, the fifth opening is filled with a part of the functional structures, and the part of the functional structures is at least partially disposed on a side of the part of the redundant electrode units facing away from the base substrate;

or wherein the functional structures comprise a light-shielding material.

13. A preparation method of a display panel, comprising:

providing a base substrate;

forming electrode units on a side of the base substrate, wherein the electrode units comprise a main electrode unit and redundant electrode units;

electrically connecting a first light element unit to the main electrode unit;

forming, on the base substrate, bank structures and openings disposed among the bank structures, wherein the openings comprise first openings, and wherein for a first opening of the first openings, a redundant electrode unit of the redundant electrode units is disposed in the first opening, wherein at least two bank structures of the bank structures are provided between adjacent redundant electrode units of the redundant electrode units; and forming functional structures, wherein for a first opening of a part of the first openings is filled with a functional structure of the functional structures, and the functional structure is at least partially disposed on a side of the redundant electrode unit facing away from the base substrate;

forming a third opening between adjacent bank structures of the bank structures, filling the third opening with a part of the functional structures;

or wherein after electrically connecting the first light-emitting unit to the main electrode unit, the method further comprises: forming a second encapsulation structure, and at least one of a fourth opening or a fifth opening; wherein the second encapsulation structure is at least partially disposed on a side of the first light-emitting unit facing away from the base substrate, and an orthographic projection of the second encapsulation structure on the base substrate covers an orthographic projection of the first light-emitting unit on the base substrate; for the fourth opening, at least one sidewall of the fourth opening is a sidewall of the second encapsulation structure, and the fourth opening is filled with a part of the functional structures; for the fifth opening, at least one sidewall of the fifth opening is a sidewall of the second encapsulation structure, and at least one sidewall of the fifth opening is a side wall of a bank structure of the bank structures, a part of the redundant electrode units is disposed in the fifth opening, the fifth opening is filled with a part of the functional structures, and the part of the functional structures is at least partially disposed on a side of the part of the redundant electrode units facing away from the base substrate;

or wherein the functional structures comprise a light-shielding material.

14. The preparation method according to claim 13, wherein after electrically connecting the first light-emitting unit to the main electrode unit and before forming the functional structures, the method further comprises:

electrically connecting a second light-emitting unit to a part of the redundant electrode units, wherein the openings further comprise a second opening, and the second light-emitting unit is disposed in the second opening; and wherein after electrically connecting the second light-emitting unit to the part of the redundant electrode units, the method further comprises:

filling the second opening with a first encapsulation structure, wherein the first encapsulation structure is at least partially disposed on a side of the second light-emitting unit facing away from the base substrate.

15. The preparation method according to claim 13, wherein forming, on the base substrate, the bank structures and the openings disposed among the bank structures, and forming the second encapsulation structure comprise:

forming an encapsulation layer on the base substrate, wherein the encapsulation layer is at least partially disposed on the side of the first light-emitting unit facing away from the base substrate and a side of the electrode units facing away from the base substrate, and an orthographic projection of the encapsulation layer on the base substrate covers the orthographic projection of the first light-emitting unit on the base substrate and an orthographic projection of the electrode units on the base substrate; and patterning the encapsulation layer through a photolithography technique to form the second encapsulation structure and the bank structures.

16. The preparation method according to claim 14, wherein filling the second opening with the first encapsulation structure comprises:

determining that an opening enclosed by two bank structures of the bank structures corresponding to the part of the redundant electrode units electrically connected to the second light-emitting unit is the second opening; and filling the second opening with the first encapsulation structure through a printing technique.

17. The preparation method according to claim 14, wherein forming the functional structure comprises:

attaching, in a heated vacuum environment, a functional structure adhesive layer to the side of the base substrate on which the bank structures are disposed, wherein an orthographic projection of the functional structure adhesive layer on the base substrate covers orthographic projections of the bank structures, the openings among the bank structures, and the first encapsulation structure on the base substrate; and thinning the functional structure adhesive layer through an ash technique or a wet etching technique to form the functional structure.

* * * * *